(12) United States Patent
Okabe et al.

(10) Patent No.: US 8,643,046 B2
(45) Date of Patent: Feb. 4, 2014

(54) SEMICONDUCTOR LIGHT-EMITTING ELEMENT, METHOD FOR PRODUCING THE SAME, LAMP, LIGHTING DEVICE, ELECTRONIC EQUIPMENT, MECHANICAL DEVICE AND ELECTRODE

(75) Inventors: Takehiko Okabe, Chiba (JP); Kyosuke Masuya, Ichihara (JP); Takashi Hodota, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 17 days.

(21) Appl. No.: 13/320,105

(22) PCT Filed: May 11, 2010

(86) PCT No.: PCT/JP2010/003191
§ 371 (c)(1),
(2), (4) Date: Nov. 11, 2011

(87) PCT Pub. No.: WO2010/131458
PCT Pub. Date: Nov. 18, 2010

(65) Prior Publication Data
US 2012/0049232 A1    Mar. 1, 2012

(30) Foreign Application Priority Data

May 14, 2009    (JP) ................................. 2009-117771
Jul. 29, 2009    (JP) ................................. 2009-176661

(51) Int. Cl.
*H01L 33/00*    (2010.01)
*H01L 21/00*    (2006.01)
(52) U.S. Cl.
USPC .............................................. 257/98; 438/29
(58) Field of Classification Search
USPC ................ 438/26–31; 257/95–100, E33.054, 257/E33.077
See application file for complete search history.

(56) References Cited

U.S. PATENT DOCUMENTS 8,093,618 B2 *   1/2012   Lee et al. ...................... 257/99
2007/0023777 A1   2/2007   Sonobe et al.

FOREIGN PATENT DOCUMENTS

| JP | 05-090329 A | 4/1993 |
|----|-------------|--------|
| JP | 9-320984 A | 12/1997 |
| JP | 11-150297 A | 6/1999 |
| JP | 11-150301 A | 6/1999 |
| JP | 2000-183400 A | 6/2000 |
| JP | 2001291899 A | 10/2001 |
| JP | 2002-043623 A | 2/2002 |

(Continued)

OTHER PUBLICATIONS

Office Action ("Notice of Reasons for Rejection") mailed on Nov. 27, 2012 for corresponding JP Application No. 2009-117771.

(Continued)

*Primary Examiner* — Calvin Lee
(74) *Attorney, Agent, or Firm* — Sughrue Mion, PLLC

(57) ABSTRACT

Disclosed is a semiconductor light-emitting element including a substrate; a laminated semiconductor layer in which an n-type semiconductor layer, a light-emitting layer and a p-type semiconductor layer are laminated on the substrate in this order; one electrode joined with the p-type semiconductor layer; and another electrode joined with the n-type semiconductor layer, wherein one or both of the one and other electrodes has a structure such that an ohmic contact layer, a metal reflection layer, a first anti-diffusion layer and a first adhesion layer are laminated in this order, and the first adhesion layer has an outer peripheral portion which extends so as to be in contact with the laminated semiconductor layer, so as to completely cover the first anti-diffusion layer.

36 Claims, 10 Drawing Sheets

(56) References Cited

FOREIGN PATENT DOCUMENTS

| | | | |
|---|---|---|---|
| JP | 2005317931 A | | 11/2005 |
| JP | 2006-183400 A | | 7/2006 |
| JP | 2006-245232 A | | 9/2006 |
| JP | 2008-016412 A | | 1/2008 |
| JP | 2008-140841 A | | 6/2008 |
| JP | 2008140841 | * | 6/2008 |
| JP | 2008-218878 A | | 9/2008 |
| JP | 2008-282851 A | | 11/2008 |
| JP | 2009094319 A | | 4/2009 |
| WO | 2006/043422 A1 | | 4/2006 |

OTHER PUBLICATIONS

International Search Report for PCT/JP2010/003191 dated Aug. 3, 2010.

Japanese Patent Office, "Decision of Rejection," issued in connection with Japanese Patent Application No. 2009-117771, dated Mar. 12, 2013.

Japanese Patent Office, "Notice of Reasons for Rejection," issued in connection with Japanese Patent Application No. 2009-176661, dated Jun. 25, 2013.

Notice of Reasons for Rejection Dated Oct. 22, 2013, issued in Japanese Patent Application No. 2009-176661.

* cited by examiner

SEMICONDUCTOR LIGHT-EMITTING ELEMENT, METHOD FOR PRODUCING THE SAME, LAMP, LIGHTING DEVICE, ELECTRONIC EQUIPMENT, MECHANICAL DEVICE AND ELECTRODE

CROSS REFERENCE TO RELATED APPLICATIONS

This application is a National Stage of International Application No. PCT/JP2010/003191 filed on May 11, 2010, which claims priorities from Japanese Patent Application Nos. 2009-117771, filed on May 14, 2009, and 2009-176661, filed on Jul. 29, 2009, the contents of all of which are incorporated herein by reference in their entirety.

TECHNICAL FIELD

The present invention relates to a semiconductor light-emitting element, a method for producing the same, a lamp, a lighting device, electronic equipment, a mechanical device and an electrode, particularly a semiconductor light-emitting element having an electrode which has improved adhesion.

BACKGROUND ART

In recent years, GaN-based compound semiconductors have attracted attention as a semiconductor material for short-wavelength light-emitting elements. A GaN-based compound semiconductor is generally formed on a substrate of single crystal sapphire, various oxides, group III-V compounds, or the like by thin film forming means such as an organic metal chemical vapor deposition method (an MOCVD method) and a molecular-beam epitaxy method (an MBE method).

A GaN-based compound semiconductor generally comprises: a laminated semiconductor layer composed of an n-type GaN-based compound semiconductor layer (hereinafter, n-type semiconductor layer), active layer (hereinafter, light-emitting layer) and p-type GaN-based compound semiconductor layer (hereinafter, p-type semiconductor layer); a p-type electrode on the p-type semiconductor layer; and an n-type electrode on the n-type semiconductor layer.

Such GaN-based compound semiconductor light-emitting elements include so-called flip-chip semiconductor light-emitting elements in which a light-emitting element is mounted on a circuit board with a substrate facing up and an electrode facing down so that light emitted from a light-emitting layer is extracted outside through the substrate.

An electrode having a reflection layer of Ag, Al or the like is formed in a flip-chip semiconductor light-emitting element, in order to reflect the light with the electrode. However, Ag and Al are metals which are likely to be oxidized, and there is a problem in that they are deteriorated by contact with external moisture and air.

Therefore, various methods have been proposed to prevent the deterioration. For example, in order to prevent contact with external moisture and air, it has been proposed to form an insulation protective layer of silicon oxide, silicon nitride or the like on the surfaces and surroundings of the p-type and n-type electrodes. Also, in order to improve insulation between the p- and n-type electrodes, it has been proposed to form an insulation protective layer between the electrodes.

Au is generally used for the outermost surface of the electrodes from the viewpoint of ease of wiring. However, since adhesion of the above silicon oxide and silicon nitride with Au is very poor, there has been a problem in that it is impossible to form a strong protective layer on the electrode. In order to solve this problem, disclosed techniques are to form an adhesion enhancing layer between Au and the insulation protective layer, so as to improve adhesion (Patent Documents 1 and 2).

However, even if adhesion between Au and the insulating protective layer is improved, there is still a problem of detachment of electrodes and low reliability of light-emitting elements in cases where adhesion is insufficient between metal of the electrode and the GaN-based compound semiconductor.

Techniques are also disclosed that surround Ag with a metal which does not react with Ag in order to use Ag, which is susceptible to oxidation and migration at a high-temperature range of 300° C. or higher (Patent Document 3), and use a platinum group metal having high reflectivity or an alloy thereof as a reflection layer (Patent Document 4).

However, even if Ag is surrounded and covered by a metal which does not react with Ag, the effect is not sufficient in cases where an Ag electrode and GaN-based compound semiconductor contact with each other in a large area. That is, when the contact area is large, there have been problems in that Ag migration to the GaN-based compound semiconductor occurs, which results in a decrease in luminous efficacy due to a decrease in reflectivity and also results in an increase in VF due to poor contact. Further, although Pt group metals are resistant to migration, they have originally lower reflectivity than Ag and it is impossible to prevent migration at a temperature reaching nearly 400° C.

PRIOR ART DOCUMENT

Patent Document

Patent Document 1
  Japanese Unexamined Patent Application, First Publication No. Hei 11-150301
Patent Document 2
  Japanese Unexamined Patent Application, First Publication No. Hei 09-320984
Patent Document 3
  Japanese Unexamined Patent Application, First Publication No. 2006-245232
Patent Document 4
  Japanese Unexamined Patent Application, First Publication No. 2000-183400

DISCLOSURE OF INVENTION

Problem to be Solved by the Invention

Under these circumstances, the present invention has been made, and an object thereof is to provide a semiconductor light-emitting element, a lamp, a lighting device, electronic equipment and an electrode, each having an electrode structure in which adhesion is improved between positive and negative electrodes (p- and n-type electrodes) and a laminated semiconductor layer (n- and/or p-type semiconductor layer) containing a GaN-based compound semiconductor.

Means for Solving the Problem

In order to achieve the above object, the present invention employs the following constructions. That is:
(First Aspect of the Present Application)
  (1) A semiconductor light-emitting element comprising a substrate; a laminated semiconductor layer in which an n-type semiconductor layer, a light-emitting layer and a p-type semiconductor layer are laminated on the substrate in this order; one electrode joined with the p-type semiconductor layer; and another electrode joined with the n-type semiconductor, layer, wherein one or both of the one and other electrodes has a structure such that an ohmic contact layer, a metal reflection layer, a first anti-diffusion layer and a first adhesion layer are laminated in this order, and the first adhesion layer has an outer peripheral portion which extends so as to be in contact with the laminated semiconductor layer, so as to completely cover the first anti-diffusion layer.

(2) The semiconductor light-emitting element according to (1), wherein the first adhesion layer comprises an inclined face at an outer peripheral portion, wherein a film thickness gradually becomes smaller toward an outer peripheral portion.

(3) The semiconductor light-emitting element according to (1) or (2), wherein the ohmic contact layer is made of a translucent conductive material selected from the group consisting of conductive oxides containing at least one of In, Zn, Al, Ga, Ti, Bi, Mg, W, Ce, Sn and Ni.

(4) The semiconductor light-emitting element according to any one of (1) to (3), wherein the metal reflection layer is made of any one selected from the group consisting of Ag, Al, Ru, Rh, Pd, Os, Ir, Pt, Ti, and alloys of these metals.

(5) The semiconductor light-emitting element according to any one of (1) to (4), wherein the first anti-diffusion layer is made of any one selected from the group consisting of Ta, Ti, Ni, and alloys of these metals.

(6) The semiconductor light-emitting element according to any one of (1) to (5), wherein the first adhesion layer is made of any one selected from the group consisting of Ta, Ti, Ni, alloys of the metals, and nitride compounds of these metals.

(7) The semiconductor light-emitting element according to any one of (1) to (6), wherein a second anti-diffusion layer is fanned to cover the first adhesion layer.

(8) The semiconductor light-emitting element according to (7), wherein the second anti-diffusion layer is made of any one selected from the group consisting of Ru, Rh, Pd, Os, Ir, Pt, W, and alloys of these metals.

(9) The semiconductor light-emitting element according to any one of (1) to (8), wherein a bonding layer is formed to cover the first adhesion layer or second anti-diffusion layer.

(10) The semiconductor light-emitting element according to (9), wherein the bonding layer is made of any one selected from the group consisting of Au, Al, and alloys of these metals.

(11) The semiconductor light-emitting element according to any one of (1) to (10), wherein a second adhesion layer is formed to cover the bonding layer.

(12) The semiconductor light-emitting element according to (11), wherein the second adhesion layer is made of any one selected from the group consisting of Ti, Ta, Ni, and alloys of these metals.

(13) The semiconductor light-emitting element according to any one of (1) to (12), wherein an insulation protective film is formed to cover the second adhesion layer.

(14) The semiconductor light-emitting element according to any one of (1) to (13), wherein the laminated semiconductor layer is mainly composed of a gallium nitride-based semiconductor. "Mainly composed of a gallium nitride semiconductor" means that at least the light-emitting layer is composed of the gallium nitride semiconductor.

(15) A lamp comprising a mounting substrate comprising one wiring portion and another wiring portion on one face, the other wiring being arranged separately from the one wiring portion; and the semiconductor light-emitting element according to any one of (1) to (14) arranged on the one face of the mounting substrate, wherein the one electrode of the semiconductor light-emitting element is connected with the one wiring portion, the other electrode of the semiconductor light-emitting element is connected with the other wiring, and the substrate of the semiconductor light-emitting element is arranged to be on an opposite side to the mounting substrate.

(16) A lighting device comprising the lamp according to (15) incorporated therein.

(17) An electronic equipment comprising the lamp according to (15) incorporated therein.

(18) An electrode for a semiconductor light-emitting element comprising a substrate; a laminated semiconductor layer in which an n-type semiconductor layer, a light-emitting layer and a p-type semiconductor layer are laminated on the substrate in this order; one electrode joined with the p-type semiconductor layer; another electrode joined with the n-type semiconductor layer which is exposed by cutting away a part of the laminated semiconductor layer, wherein one or both of the one and other electrodes has a structure such that an ohmic contact layer, a metal reflection layer, a first anti-diffusion layer and a first adhesion layer are laminated in this order, and the first adhesion layer includes an outer peripheral portion which extends so as to be in contact with the laminated semiconductor layer, so as to completely cover the first anti-diffusion layer.

(19) The electrode for a semiconductor light-emitting element according to (18), wherein the first adhesion layer includes an inclined face at an outer peripheral portion, wherein a film thickness gradually becomes smaller toward an outer peripheral side.

(20) The electrode for a semiconductor light-emitting element according to (18) or (19), wherein a bonding layer is formed to cover the first adhesion layer.

(Second Aspect of the Present Application)

(21) A semiconductor light-emitting element comprising a substrate; a laminated semiconductor layer in which an n-type semiconductor layer, a light-emitting layer and a p-type semiconductor layer are laminated on the substrate in this order; one electrode joined with the p-type semiconductor layer; another electrode joined with the n-type semiconductor layer, wherein one or both of the one and other electrodes has a structure such that an ohmic contact layer, a metal reflection layer and a first anti-diffusion layer are laminated in this order, and the ohmic contact layer is made of an oxide containing at least one metal selected from the group consisting of In, Zn, Al, Ga, Ti, Bi, Mg, W, Ce, Sn and Ni.

(22) The semiconductor light-emitting element according to (21), wherein the ohmic contact layer comprises any one of ITO, IZO, AZO or GZO.

(23) The semiconductor light-emitting element according to (21) or (22), wherein the ohmic contact layer has a maximum thickness of 1 nm to 500 nm.

(24) The semiconductor light-emitting element according to any one of (21) to (23), wherein the ohmic contact layer includes an inclined face at an outer peripheral portion, wherein a film thickness gradually becomes smaller toward an outer peripheral portion.

(25) The semiconductor light-emitting element according to any one of (21) to (24), wherein the metal reflection layer is made of Ag or Rh, or an alloy containing any one of these metals.

(26) The semiconductor light-emitting element according to any one of (21) to (25), wherein the metal reflection layer comprises an APC alloy or an ANC alloy.

(27) The semiconductor light-emitting element according to any one of (21) to (26), wherein the metal reflection layer has a maximum thickness of 20 nm to 3,000 nm.

(28) The semiconductor light-emitting element according to any one of (21) to (27), wherein the metal reflection layer includes an inclined face at an outer peripheral portion, wherein a film thickness gradually becomes smaller toward an outer peripheral portion.

(29) The semiconductor light-emitting element according to any one of (21) to (28), wherein the first anti-diffusion layer is made of any one metal of Ti, Ni, Ta, Cr and Nb, any one of nitrides of the metals, or any one of alloys of the metals.

(30) The semiconductor light-emitting element according to any one of (21) to (29), wherein the first anti-diffusion layer includes an inclined face at an outer peripheral portion, wherein a film thickness gradually becomes smaller toward an outer peripheral portion.

(31) The semiconductor light-emitting element according to any one of (21) to (20), wherein the laminated semiconductor layer is mainly composed of a gallium nitride-based semiconductor.

(32) A lamp comprising the semiconductor light-emitting element according to any one of (21) to (21); and a mounting substrate; wherein the mounting substrate comprises one wiring portion and another wiring portion on one face, the other wiring being arranged separately from the one wiring portion, the semiconductor light-emitting element is arranged so that the substrate of the semiconductor light-emitting element is on an opposite side to the mounting substrate, the one electrode of the semiconductor light-emitting element is connected with the one wiring portion, and another electrode of the semiconductor light-emitting element is connected with the other wiring portion.

(33) A method for producing the semiconductor light-emitting element according to any one of (21) to (21) wherein the step of forming one or both of the one and other electrodes of the semiconductor light-emitting element comprises the steps of: forming the ohmic contact layer onto one or both of the p-type semiconductor layer and n-type semiconductor layer; heat-treating the ohmic contact layer; and laminating the metal reflection layer and first anti-diffusion layer onto the ohmic contact layer in this order.

(34) A lamp comprising the semiconductor light-emitting element according to any one of (21) to (21).

(35) Electronic equipment comprising the lamp according to (22) or (24) incorporated therein.

(36) A mechanical device comprising the electronic equipment according to (25) incorporated therein.

Effects of the Invention

According to the above constructions, it is possible to provide a semiconductor light-emitting element, lamp, lighting device, electronic equipment and electrode each having an electrode structure in which adhesion is improved between one or both of positive and negative electrodes (p- and n-type electrodes) and a n- and/or p-type semiconductor layer, on which the electrode is formed.

It is also possible to provide a flip-chip semiconductor having the electrode structure with the metal reflection layer, method for producing the same, lamp and lighting device.

The present invention is a semiconductor light-emitting element comprising: a substrate; a laminated semiconductor layer in which an n-type semiconductor layer, a light-emitting layer and a p-type semiconductor layer are laminated on the substrate in this order; one electrode joined with the p-type semiconductor layer; and another electrode joined with the n-type semiconductor layer, wherein one or both of the one and other electrodes has a structure such that an ohmic contact layer, a metal reflection layer, and a first anti-diffusion layer are laminated in this order, and the first adhesion layer has an outer peripheral portion which extends so as to be in contact with the laminated semiconductor layer, so as to fully cover the first anti-diffusion layer. Therefore it is possible to improve adhesion between the electrodes and GaN-based compound semiconductor layer.

The semiconductor light-emitting element of the present invention comprises: a substrate; a laminated semiconductor layer in which an n-type semiconductor layer, a light-emitting layer and a p-type semiconductor layer are laminated on the substrate in this order; one electrode joined with the p-type semiconductor layer; and another electrode joined with the n-type semiconductor layer, wherein one or both of the one and other electrodes has a structure such that an ohmic contact layer, a metal reflection layer, and a first anti-diffusion layer are laminated in this order, and the first adhesion layer has an outer peripheral portion which extends so as to be in contact with the laminated semiconductor layer, so as to fully cover the first anti-diffusion layer. Therefore it is possible to improve adhesion of the electrodes with the laminated semiconductor layer, so as to prevent the electrodes from being peeled off by tension stress in joining them with wiring of a mounting substrate. It is also possible to improve production efficiency of the semiconductor light-emitting element as well as to extend the life of the semiconductor light-emitting element.

According to the present invention, it is possible to provide a flip-chip semiconductor light-emitting element comprising an electrode structure in which one or both of n- and p-type electrodes comprises a metal reflection layer and adhesion is improved between the electrodes and n- and p-type semiconductor layers on which the electrodes are formed, a method for producing the same, a lamp and a lighting device.

According to the semiconductor light-emitting element of the present invention, the outer end part of the first adhesion layer overhangs to be in contact with one or both of the n- and p-type semiconductor layers of the laminated semiconductor layer. Therefore it is possible to provide an inclined face wherein a film thickness gradually becomes smaller toward the outer peripheral portion. As a result, it is possible to improve adhesion of the electrodes with the laminated semiconductor layer so as to prevent moisture and air from penetrating from outside, and thus to improve reliability.

According to the semiconductor light-emitting element of the present invention, the bonding layer is formed to cover the first adhesion layer or second anti-diffusion layer, and the second adhesion layer contacts to completely cover the bonding layer. Therefore it is possible to improve adhesion with the insulation protective film. Accordingly, it is possible to improve adhesion of the electrodes themselves with the laminated semiconductor layer. As a result, it is possible to prevent moisture and air from penetrating from outside, so as to improve reliability.

The lamp of the present invention comprises: a mounting substrate comprising one wiring portion and another wiring portion on one face, the other wiring being arranged separately from the one wiring portion; and the semiconductor light-emitting element according to any one of (1) to (14) arranged on the one face of the mounting substrate, wherein the one electrode of the semiconductor light-emitting element is connected with the one wiring portion, the other electrode of the semiconductor light-emitting element is connected with the other wiring, and the substrate of the semiconductor light-emitting element is arranged to be on an opposite side to the mounting substrate. Therefore it is possible to improve adhesion of the electrode with the laminated semiconductor layer, so as to obtain the lamp having high reliability.

Since the lighting device of the present invention includes the above-described lamp incorporated therein, it is possible for it to comprise the electrodes which are improved in adhesion with the laminated semiconductor layer.

Since the electronic equipment of the present invention includes the above-described lamp incorporated therein, it is possible for it to comprise the electrodes which are improved in adhesion with the laminated semiconductor layer.

The electrode for a semiconductor light-emitting element of the present invention comprises a substrate; a laminated semiconductor layer in which an n-type semiconductor layer, a light-emitting layer and a p-type semiconductor layer are laminated on the substrate in this order; one electrode joined with the p-type semiconductor layer; the other electrode joined with the n-type semiconductor layer, wherein one or both of the one and other electrodes has a structure such that an ohmic contact layer, a metal reflection layer, a first anti-diffusion layer and a first adhesion layer are laminated in this order, and the first adhesion layer comprises an outer peripheral portion which extends so as to be in contact with the laminated semiconductor layer, so as to fully cover the first anti-diffusion layer. Therefore it is possible to improve adhesion of the electrode with the laminated semiconductor layer so as to prevent moisture and air from penetrating from outside, and thus to make the electrode resistant to deterioration.

According to the constructions of the present invention, satisfactory ohmic contact is established between the positive and negative electrodes (n- and/or p-type electrode) and the laminated semiconductor layer (n- and/or p-type semiconductor layer contacting with the electrodes) of semiconductor, and migration of Ag (silver) to the compound semiconductor is effectively prevented even under severe conditions. Therefore it is possible to provide the semiconductor light-emitting element having high reliability and quality, method for producing the same, lamp, electronic equipment and mechanical device.

The semiconductor light-emitting element of the present invention preferably has a structure such that one or both of the one and other electrodes has a structure such that an ohmic contact layer, a metal reflection layer and a first anti-diffusion layer are laminated in this order, and the first anti-diffusion layer is made of an oxide containing any metal of In, Zn, Al, Ga, Ti, Bi, Mg, W, Ce, Sn and Ni. Therefore it is possible that the ohmic contact layer and first anti-diffusion layer prevent the component of the metal reflection layer from diffusion, so as to prevent a decrease in the reflectivity of the metal reflection layer. In particular, even when the electrodes are heated in flip-chip joining, it is possible to prevent the component of the metal reflection layer from diffusion, so as to prevent a decrease in the reflectivity of the metal reflection layer. It is also possible to improve transmittance of the ohmic contact layer, so as to improve luminous efficacy of the semiconductor light-emitting element. Furthermore, it is possible to improve electric conductivity between the p-type electrode and p-type semiconductor layer by ohmic contact between the ohmic contact layer and p-type semiconductor layer, so as to improve luminous efficacy of the semiconductor light-emitting element.

BEST MODE FOR CARRYING OUT THE INVENTION

Preferred embodiments for carrying out the present invention will be described below. However, the present invention is not limited to the following examples, and modifications, additions and omissions may be made as needed in the number, position, material, shape and the like, unless otherwise specifically limited.

(First Embodiment)

Figure 1:
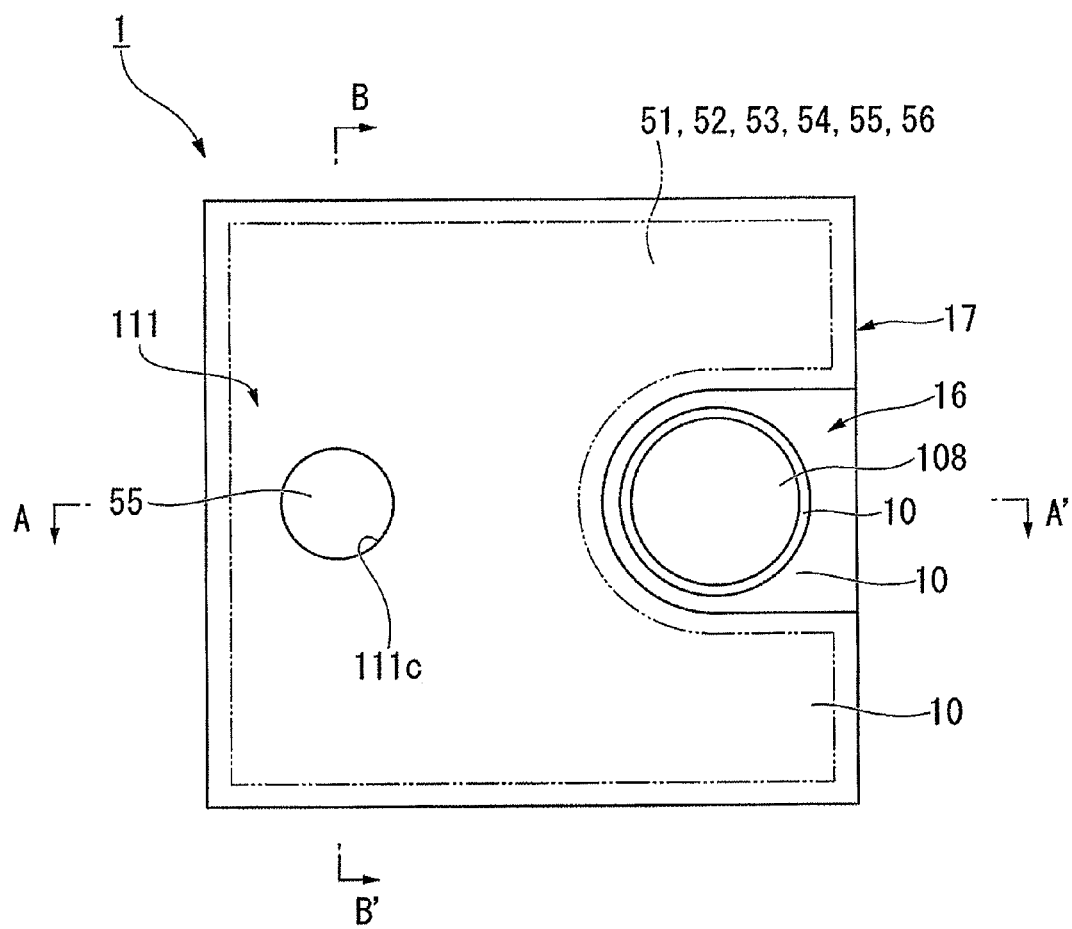
FIG. 1 is a schematic plan view showing an example of a semiconductor light-emitting element of the present invention.
Figure 2:
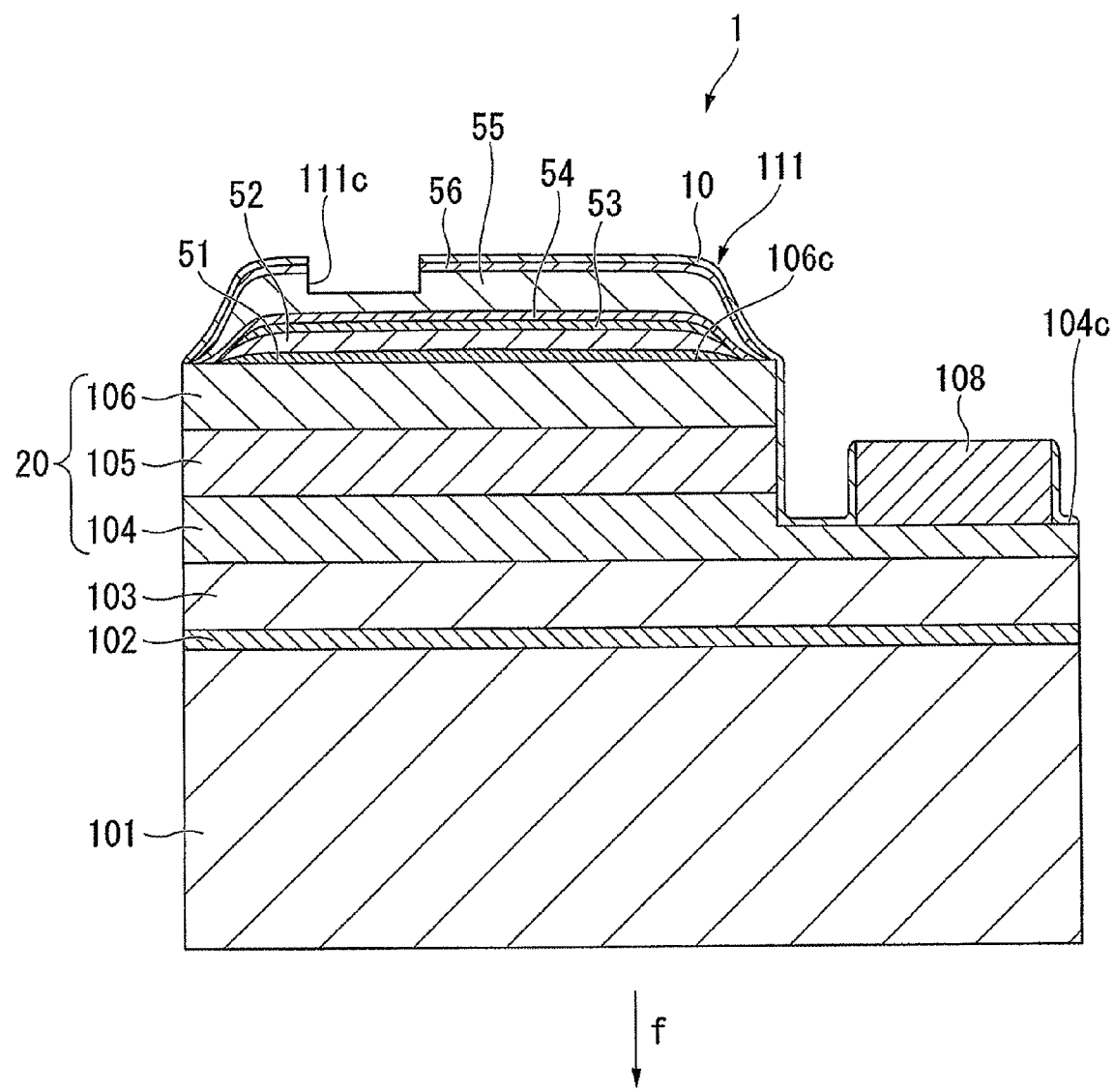
FIG. 2 is a schematic sectional view taken along lines A-A' in FIG. 1.
Figure 3:
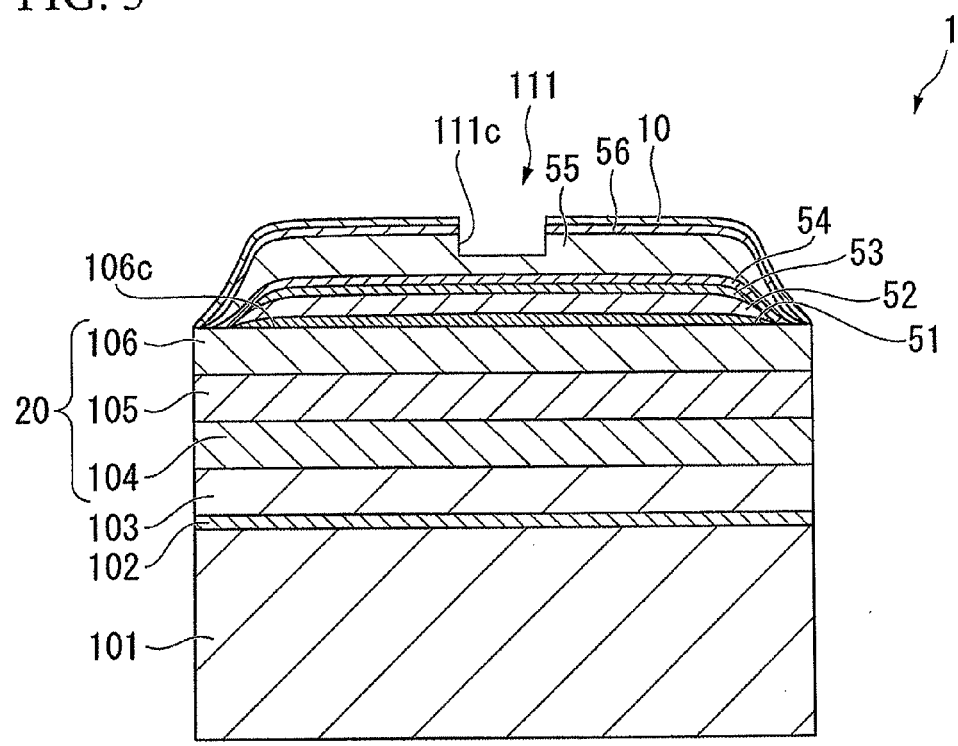
FIG. 3 is a schematic sectional view taken along lines B-B' in FIG. 1.
Figure 4:
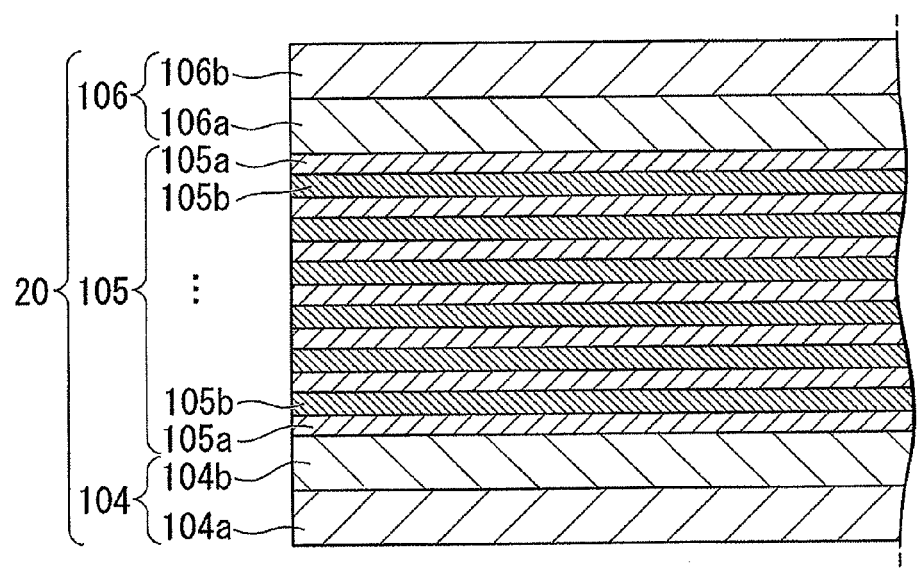
FIG. 4 is a schematic cross-sectional view showing an example of a laminated semiconductor layer of a semiconductor light-emitting element of the present invention.
Figure 5:
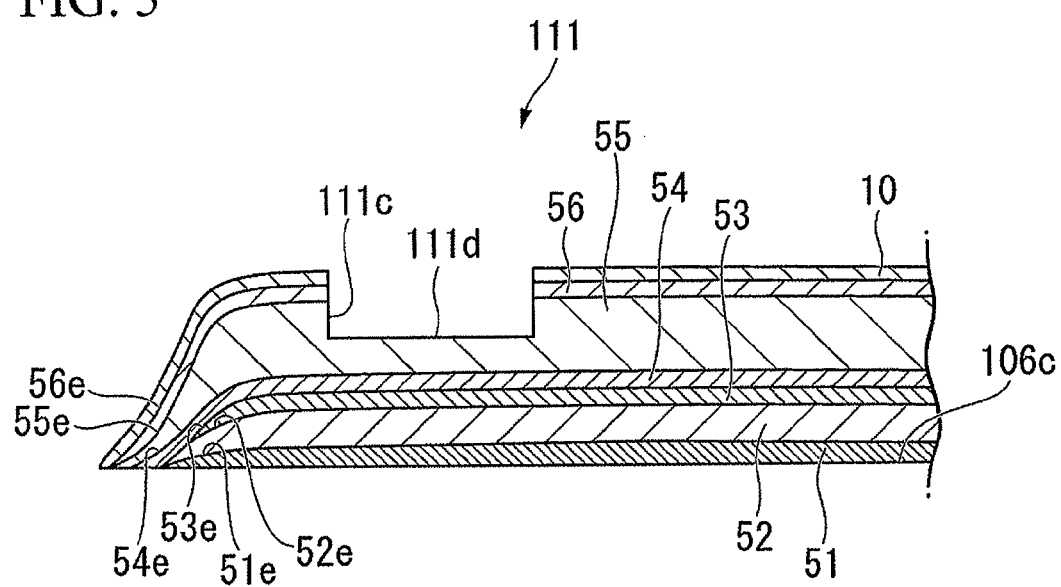
FIG. 5 is an enlarged cross-sectional view of an example of a p-type electrode of the semiconductor light-emitting element of the present invention.

FIGS. 1 to 5 show an example of a semiconductor light-emitting element, which is an embodiment of the present invention. FIG. 1 is a schematic plan view of the semiconductor light-emitting element, which is the embodiment of the present invention, FIG. 2 is a schematic cross-sectional view taken along lines A-A' in FIG. 1, FIG. 3 is a schematic cross-sectional view taken along lines B-B' in FIG. 1, FIG. 4 is a schematic cross-sectional view of a laminated semiconductor layer which constitutes the semiconductor light-emitting element shown in FIG. 1, and FIG. 5 is an enlarged cross-sectional view of a p-type electrode of the semiconductor light-emitting element shown in FIG. 1.

(Semiconductor Light Emitting Element)

As shown in FIG. 1, a semiconductor light-emitting element 1 has a rectangular shape in a plan view. One side thereof is cut away in a half-circular and half-rectangular shape, so that a cutout 16 and a cutout body 17 are defined.

An n-type electrode 108 having an approximately circular shape in a plan view is provided in the cutout 16. The side wall of the n-type electrode 108 and the surroundings thereof are covered with a protective film 10.

The cutout body 17 of the semiconductor light-emitting element 1 is also covered with the protective film 10. A bonding layer 55 is exposed in a concave (recess) 111c which has a circular shape in a plan view and is provided in a part of the protective layer 10. Under the protective film 10 of the cutout body 17, an ohmic contact layer 51, a metal reflection layer 52, a first anti-diffusion layer 53, a first adhesion layer 54, a bonding layer 55 and a second adhesion layer 56 are placed in this order from the bottom in the almost same shape as the cutout body 17, of which a p-type electrode 111 is composed.

As shown in FIGS. 2 and 3, the semiconductor light-emitting element 1 of the present invention extracts light in the direction fat the side of a substrate 101. A buffer layer 102, a base layer 103 and a laminated semiconductor layer 20 are sequentially laminated on the substrate 101. The p-type electrode 111 is formed on the laminated semiconductor layer 20 at a face (hereinafter, top face) 106c opposite to the face where the substrate 101 is provided. The n-type electrode 108 is formed on an exposed face 104c of the n-type semiconductor layer 104, which is formed by cutting away a part of the laminated semiconductor layer 20. The foregoing is a general constitution of the semiconductor light-emitting element 1. The laminated semiconductor layer 20 is constituted by the n-type semiconductor layer 104, a light-emitting layer 105 and the p-type semiconductor layer 106 which are laminated in this order from the side of the substrate 101.

The p-type electrode 111 is constituted by the ohmic contact layer 51, metal reflection layer 52, first anti-diffusion layer 53, first adhesion layer 54, bonding layer 55, second adhesion layer 56 and protective film 10 which are laminated in this order on the top face 106c of the p-type semiconductor layer 106.

The protective layer 10 covers the semiconductor layer exposed face 104c and the side face of the n-type electrode 108 as well as the top and side faces of the p-type semiconductor layer 106.

The respective members will be described below.

<Substrate>

The substrate 101 is not limited specifically, and any substrate may be employed, as long as it is transparent and a group III nitride semiconductor crystal can be grown epitaxially on its surface. For example, there can be used substrates of sapphire, zinc oxide, magnesium oxide, zirconium oxide, magnesium aluminum oxide, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum and the like.

In particular, a sapphire substrate having a main face of c-plane is preferably employed, and it is preferable to form the buffer layer 102 on the c-plane of sapphire.

<Laminated Semiconductor Layer>

A laminated semiconductor layer 20 is selected as necessary. For example, preferable is a layer of a group III nitride semiconductor in which the n-type semiconductor layer 104, light-emitting layer 105 and p-type semiconductor layer 106 are laminated on the substrate 101 in this order as shown in FIGS. 2 and 3. The laminated semiconductor layer 20 may further include the base layer 103 and buffer layer 102.

As shown in FIG. 4, the n-type semiconductor layer 104, light-emitting layer 105 and p-type semiconductor layer 106 may be each composed of a plurality of semiconductor layers.

The laminated semiconductor layer 20 having fine crystallinity can be obtained by an MOCVD method. Even by sputtering, however, a semiconductor layer having better crystallinity than by an MOCVD can be formed under optimized conditions. They will be described below individually.

<Buffer Layer>

The buffer layer 102 is selected as needed. It is preferably made of polycrystalline $Al_xGa_{1-x}N$ ($0 \le x \le 1$), and more preferably single-crystalline $Al_xGa_{1-x}N$ ($0 \le x \le 1$).

For example, the buffer layer 102 may be a layer of polycrystalline $Al_xGa_{1-x}N$ ($0 \le x \le 1$) having a thickness of 0.01 μm to 0.5 μm as described above. When the buffer layer 102 has a thickness of less than 0.01 μm, the buffer layer 102 may not have a sufficient effect of mitigating a difference in lattice constant between the substrate 101 and base layer 103. When the buffer layer 102 has a thickness of more than 0.5 μm, a film deposition process of the buffer layer 102 takes a longer time, which may result in lower productivity despite no change in the function of the buffer layer 102.

The buffer layer 102 has the functions of mitigating a difference in lattice constant between the substrate 101 and base layer 103 and making it easier to form a c axis-oriented monocrystalline layer on the (0001) c-plane of the substrate 101. Therefore it is possible to laminate the base layer 103 having even better crystallinity, when the base layer 103 of single crystal is laminated on the buffer layer 102. In the present invention, it is preferable to carry out a buffer layer forming step, although it is not necessary.

The buffer layer 102 may have a hexagonal crystal structure of a group III nitride semiconductor. The crystal of the group III nitride semiconductor of the buffer layer 102 may or may not have a single crystal structure, and one having a single crystal structure is preferably used. By controlling growth conditions, the crystal of the group III nitride semiconductor grows not only in the upward direction but also in the in-plane direction, so as to form a single crystal structure. Therefore it is possible to form the buffer layer 102 made of a single crystal group III nitride semiconductor by controlling its deposition conditions. When the buffer layer 102 having such a single crystal structure is deposited on the substrate 101, the buffer layer 102 exerts the buffering function effectively. The group III nitride semiconductor deposited thereon thus becomes a crystal film having satisfactory orientation and crystallinity.

It is also possible to make the group III nitride semiconductor constituting the buffer layer 102 to be a columnar crystal having an aggregate structure mainly composed of hexagonal columns (polycrystal) by controlling the deposition conditions. The "columnar crystal having an aggregate structure" means a crystal in which adjacent crystal grains are separated from each other by a grain boundary formed therebetween, and each grain has a columnar shape in cross-section.

<Base Layer>

The base layer 103 is selected as needed. $Al_xGa_yIn_zN$ ($0 \leq x \leq 1$, $0 \leq y \leq 1$, $0 \leq z \leq 1$, $x+y+z=1$) can be given as an example, and it is preferable to employ $Al_xGa_{1-x}N$ ($0 \leq x \leq 1$) since it can form the base layer 103 having satisfactory crystallinity.

The base layer 103 has a film thickness of preferably 0.1 µm or more, more preferably 0.5 µm or more, and most preferably 1 µm or more. The film thicknesses as above make it easier to obtain an $Al_xGa_{1-x}N$ layer having satisfactory crystallinity. The upper limit may not be specifically defined, but for example, it is preferably 6 µm or less.

It is preferable not to dope an impurity to the base layer 103 in order to improve the crystallinity of the base layer 103. However, if p- or n-type conductivity is required, it is possible to dope an acceptor or donor impurity.

<N-Type Semiconductor>

The n-type semiconductor layer 104, which is included in the laminated semiconductor layer, is selected as needed. As shown in FIG. 4, it is generally preferable that it be composed of an n-contact layer 104a and an n-clad layer 104b. It is also possible for the n-contact layer 104a to double as the n-clad layer 104b. Also, the n-type semiconductor layer 104 includes the above base layer.

The n-contact layer 104a is for installing the n-type electrode. The n-contact layer 104a is preferably composed of an $Al_xGa_{1-x}N$ layer ($0 \leq x < 1$, preferably $0 \leq x \leq 0.5$, and more preferably $0 \leq x \leq 0.1$).

It is preferable that the n-contact layer 104a be doped with an n-type impurity. From the viewpoint of retaining satisfactory ohmic contact with the n-type electrode, it is preferable to contain the n-type impurity at a concentration of $1 \times 10^{17}$ to $1 \times 10^{20}/cm^3$, preferably $1 \times 10^{18}$ to $1 \times 10^{19}/cm^3$. There is no particular limitation on the n-type impurity, and examples of the n-type impurity include Si, Ge, Sn and the like. Si and Ge are preferable.

The n-contact layer 104a has a film thickness of preferably 0.5 to 5 µm, and more preferably in the range of 1 to 3 µm. When the n-contact layer 104a has a film thickness within the above range, satisfactory crystallinity of the semiconductor is maintained.

It is preferable that the n-clad layer 104b be provided between the n-contact layer 104a and light-emitting layer 105. The n-clad layer 104b is provided to inject and confine carriers in the light-emitting element 105. The n-clad layer 104b can be formed with AlGaN, GaN, GaInN or the like. It is also possible to join these structures with each other by a hetero-junction, or to laminate them plural times to form a super-lattice structure. When the n-clad layer 104b is formed with GaInN, it goes without saying that the band gap thereof is desirably made larger than that of GaInN of the light-emitting layer 105.

There is no particular limitation on the film thickness of the n-clad layer 104b, and the film thickness is preferably 0.005 µm to 0.5 µm, and more preferably 0.005 µm to 0.1 µm. The n-clad layer 104b has an n-type doping concentration of preferably $1 \times 10^{17}$ to $1 \times 10^{20}/cm^3$, and more preferably $1 \times 10^{18}$ to $1 \times 10^{19}/cm^3$. It is preferable that the doping concentration be within the above range from the viewpoint of retaining satisfactory crystallinity and reducing working voltage of the element.

Although not shown in detail, when the n-clad layer 104b has a super-lattice structure, it may have a laminated structure of an n-side first layer of a group III nitride semiconductor having a film thickness of 100 Å or less and an n-side second layer also of a group III nitride semiconductor having a film thickness of 100 Å or less but having a different composition from the n-side first layer.

Also, the n-clad layer 104b may have a repeatedly laminated structure of the alternating n-side first and second layers. Preferably, one of the n-side first and second layers is in contact with the active layer (light-emitting layer 105).

<Light Emitting Layer>

The light-emitting layer 105, which is laminated on the n-type semiconductor layer 104, is selected as needed. For example, the light-emitting layer 105 has a single quantum well structure, multiple quantum well structure, or the like.

A group III nitride semiconductor layer of $Ga_{1-y}In_yN$ ($0 < y < 0.4$) is generally employed as a well layer 105b of a quantum well structure as shown in FIG. 4. The well layer 105b may have a film thickness with which a quantum effect is achieved, for example, 1 nm to 10 nm. Preferably, it is 2 nm to 6 nm from the viewpoint of light output.

When the light-emitting layer 105 has a multiple quantum well structure, the above $Ga_{1-y}In_yN$ is used as the well layer 105b and $Al_zGa_{1-z}N$ ($0 \leq z < 0.3$), which has larger bandgap energy than the well layer 105b, is used as a barrier layer 105a. The well layer 105b and barrier layer 105a may not be doped with impurity depending on the design.

<P-Type Semiconductor Layer>

The p-type semiconductor layer 106 is selected as needed. As shown in FIG. 4, it is generally composed of a p-clad layer 106a and p-contact layer 106b. It is also possible that the p-contact layer 106b doubles as the p-clad layer 106a.

The p-clad layer 106a is a layer to confine and inject carriers in the light-emitting layer 105. There is no particular limitation on the p-clad layer 106a as long as its composition provides a larger bandgap energy than the light-emitting layer 105 and it can confine carriers in the light-emitting element 105. Preferably, the layer made of $Al_xGa_{1-x}N$ ($0 < x \leq 0.4$) is cited.

The clad layer 106a made of such AlGaN is preferable from the viewpoint of confinement of carriers in the light-emitting layer. There is no particular limitation on the film thickness of the p-clad layer 106a, and the film thickness is preferably 1 to 400 nm, and more preferably 5 to 100 nm.

The p-type doping concentration of the p-clad layer 106a is preferably $1 \times 10^{18}$ to $1 \times 10^{21}/cm^3$, and more preferably $1 \times 10^{19}$ to $1 \times 10^{20}/cm^3$. When the p-type doping concentration is within the above range, it is possible to obtain a satisfactory p-type crystal without deteriorating crystallinity.

The p-clad layer 106a may be multiple lamination, so as to have super-lattice structure.

Although not shown in detail, when the p-clad layer 106a has a super-lattice structure, it may include a laminated structure of a p-type first layer made of a group III nitride semiconductor having a film thickness of 100 Å or less and a p-type second layer also made of a group III nitride semiconductor having a film thickness of 100 Å or less, but having a different composition from that of the p-type first layer. Also, the p-clad layer 106a may have a repeatedly laminated structure of the alternating p-type first and second layers.

The p-contact layer 106b is for installing a positive electrode. The p-contact layer 106b is preferably $Al_xGa_{1-x}N$ ($0 \leq x \leq 0.4$). It is preferable that the Al component be within this range from the viewpoint of retaining satisfactory crystallinity and satisfactory ohmic contact with a p-ohmic electrode.

It is preferable to contain a p-type impurity (dopant) at a concentration of $1\times10^{18}$ to $1\times10^{21}/cm^3$, preferably $5\times10^{19}$ to $5\times10^{20}/cm^3$ from the viewpoint of retaining satisfactory ohmic contact, preventing cracks and retaining satisfactory crystallinity. There is no particular limitation on the p-type impurity, and examples of the p-type impurity preferably includes Mg.

There is no particular limitation on the film thickness of the p-contact layer 106b, and the film thickness is preferably 0.01 μm to 0.5 μm, and more preferably 0.05 μm to 0.2 μm. It is preferable that the film thickness of the p-contact layer 106b be within the above range from the viewpoint of light output.

<P-Type Electrode>

FIG. 5 is an enlarged cross-sectional view of an example of the p-type electrode 111 of the semiconductor light-emitting element 1 which is the embodiment of the present invention shown in FIG. 2.

As shown in FIG. 5, the p-type electrode 111 is schematically constituted by the lamination of the ohmic contact layer 51, metal reflection layer 52, first anti-diffusion layer 53, first adhesion layer 54, bonding layer 55, second adhesion layer 56 and insulation protective film 10.

<Ohmic Contact Layer>

As shown in FIG. 5, the ohmic contact layer 51 is formed on the top face 106c of the p-type semiconductor 106. At the outer end part thereof, it comprises an inclined face 51e wherein a film thickness gradually becomes smaller toward the outer peripheral portion.

The ohmic contact layer 51 preferably has low contact resistance with the p-type semiconductor layer 106. Since the light from the light-emitting element 105 is extracted on the side of a metal reflection layer 52, the ohmic contact layer 51 preferably has superior optical transparency. Also, in order to diffuse electric current to almost whole face of the p-type semiconductor layer 106, the ohmic contact layer 51 preferably has superior conductivity.

As for the component of the ohmic contact layer 51, it is preferably selected from the group consisting of conductive oxides each including any one kind of In, Zn, Al, Ga, Ti, Bi, Mg, W, Ce, Sn and Ni. As for the component of the ohmic contact layer 51, any transparent conductive material is possible. For example, preferable are translucent (transparent) conductive materials selected from the group consisting of conductive oxides each including any one kind of In, Zn, Al, Ga, Ti, Bi, Mg, W, Ce, Sn and Ni. Among them, indium oxide and titanium oxide are particularly preferable. When Ag is used for the metal reflection layer, these conductive oxides are preferable also since they do not react with Ag and thus prevent Ag from diffusing to the ohmic contact layer.

The conductive indium oxide may have any composition as long as it is transparent and conductive and includes indium element in the oxide. For example, ITO (indium tin oxide, $In_2O_3$—$SnO_2$), IZO (indium zinc oxide, $In_2O_3$—$ZnO$) and IGO (indium gallium oxide, $In_2O_3$—$Ga_2O_3$) can be given. The conductive titanium oxide includes titanium oxide. As for the other transparent conductive materials than indium oxide and titanium oxide, for example, AZO (aluminum zinc oxide, $ZnO$—$Al_2O_3$), GZO (gallium zinc oxide, $ZnO$—$Ga_2O_3$), fluorine-doped tin oxide, niobium-doped titanium oxide and the like may be employed.

The ohmic contact layer 51 may be formed by providing these materials using common means well-known in the art. Thermal annealing may be performed after forming the ohmic contact layer 51 for the purpose of alloying and transparency, although annealing may not be performed.

The ohmic contact layer 51 including indium oxide may has a crystallized structure. In particular, transparent electrodes (for example, known ITO, IZO and the like) containing $In_2O_3$ crystal having a hexagonal crystal structure or bixbite structure are preferably employed.

The ohmic contact layer 51 has a thickness of desirably 1 nm to 500 nm, more desirably 2 nm to 200 nm, and still more desirably 3 nm to 100 nm.

<Metal Reflection Layer>

As shown in FIG. 5, the metal reflection layer 52 is formed to fully cover the ohmic contact layer 51. At the outer peripheral part thereof, it comprises an inclined face 52e wherein a film thickness gradually becomes smaller toward the outer peripheral portion.

That is, the metal reflection layer 52 is formed so that it completely covers over the edges of the ohmic contact layer 51, i.e. the boundary which defines the outline of the ohmic contact layer 51 in a plan view. That is, in a plan view, the metal reflection layer 52 covers the ohmic contact layer 51, and further overhangs outside of the outer peripheral portion of the ohmic contact layer 51. With this construction, it is possible that any part of the ohmic contact layer 51 is not exposed from the metal reflection layer 52.

The metal reflection layer 52 is preferably made of highly reflective metal. For example, it is more preferably made of platinum group metals such as Ru, Rh, Pd, Os, Ir and Pt, Al, Ag, Ti and the alloys containing at least one kind of these metals, and the like. With this construction, it is possible to effectively reflect light from the light-emitting element 105.

Among them, Al, Ag, Pt and the alloys containing at least one kind of these metals are general material for electrodes and are excellent from the viewpoint of ease of availability and ease of handling.

It is preferable that the metal reflection layer 52 be closely in contact with the ohmic contact layer 51 since it effectively reflects light from the light-emitting layer 105 and joining of the p-type electrode 111 is improved. In order that the p-type electrode 111 has sufficient strength, it is necessary that the metal reflection layer 52 is jointed rigidly to the ohmic contact layer 51.

The metal reflection layer 52 is preferably a known Ag—Pd—Cu (APC) alloy or Ag—Nd—Cu (ANC) alloy. The APC or ANC alloy is an alloy containing Ag and has high optical reflectivity, and is excellent from the viewpoint of ease of availability and ease of handling.

The reflectivity of the p-type electrode 111 can be changed according to the constituent material of the metal reflection layer 52, and is preferably 60% or more, more preferably 80% or more, and still more preferably 90% or more.

Reflectivity can be measured comparatively easily using a spectrophotometer or the like. However, it is difficult to measure the reflectivity of the p-type electrode 111 due to its small area. For example, in case of forming the p-type electrode 111, an electrode similar to the p-type electrode 111 is formed on a "dummy substrate" made of transparent glass having a large area and the reflectivity can be measured using the obtained one as a sample.

The metal reflection layer 52 has a maximum thickness of desirably 20 nm to 3,000 nm, more desirably 50 nm to 1,000 nm, and most desirably 100 nm to 500 nm. When the metal reflection layer 52 is too thin, it is impossible to obtain a sufficient effect of reflection. In contrast, when the metal reflection layer 52 is too thick, it brings no particular advantage, and longer process time and waste of the material may only arise.

<First Anti-Diffusion Layer>

As shown in FIG. 5, the first anti-diffusion layer 53 is completely to fully cover the metal reflection layer 52. At the outer peripheral part thereof, it comprises an inclined face 53e wherein a film thickness gradually becomes smaller toward the outer peripheral portion.

That is, the first anti-diffusion layer 53 is formed so that it fully covers the edges of the metal reflection layer 52, i.e. the boundary which define the outline of the metal reflection layer 52 in a plan view. That is, although it is rather difficult to understand in FIG. 5, in a plan view, the first anti-diffusion layer 53 covers the metal reflection layer 52 and further extends outside of the outer peripheral portion of the metal reflection layer 52. With this construction, it is possible that any part of the metal reflection layer 52 is not exposed from the first anti-diffusion layer 53.

The first anti-diffusion layer 53 is preferably made of any metal of Ti, Ni, Ta, Cr and Nb, nitride of these metals, or an alloy containing any of these metals. When these materials are employed as the first anti-diffusion layer 53, it is possible to prevent the metal material such as Ag of the metal reflection layer 52 from diffusing to the side of the bonding layer 55.

The first anti-diffusion layer 53 has a maximum thickness in a range of desirably 50 nm or more, more desirably 100 nm or more, and still more desirably 200 nm or more. When the first anti-diffusion layer 53 has a maximum thickness in a range of 50 nm or more, it becomes possible to prevent the metal material such as Ag of the metal reflection layer 52 from diffusing to the bonding layer and the like. From the viewpoint of material cost, the first anti-diffusion layer 53 has a maximum thickness of preferably 5,000 nm or less.

<First Adhesion Layer>

The first embodiment of the present invention essentially includes a first adhesion layer. Meanwhile, the second embodiment of the present invention does not include this first adhesion layer essentially, but may optionally include it. A light-emitting element of the second embodiment which does not comprises the first adhesion layer can be produced by omitting the step of producing the first adhesion layer.

As shown in FIG. 5, the first adhesion layer 54 is formed to completely cover the first anti-diffusion layer 53. At the outer peripheral part thereof, an outer peripheral portion 54d is formed, which contacts with the top face 106c of the p-type semiconductor layer 106. At the outer peripheral part 54d, an inclined face 54e is formed, which has a film thickness that gets gradually thinner toward the outer peripheral portion.

The first adhesion layer 54 is formed so that it overhangs outside of the outer peripheral portion of the first anti-diffusion layer 53 in a plan view, i.e. completely covers the first anti-diffusion layer 53. With this construction, it is possible to improve shielding of the ohmic contact layer 51, metal reflection layer 52 and first anti-diffusion layer 53.

The first adhesion layer 54 has the function of improving adhesion with the laminated semiconductor layer (n- and/or p-type semiconductor layer) of the GaN-based compound semiconductor by contacting with the laminated semiconductor layer, as well as it completely covers over edges of the first anti-diffusion layer 53, i.e. the boundary which defines the outline of the first anti-diffusion layer 53 in a plan view.

The first adhesion layer 54 is preferably made of Ta, Ti, Ni or an alloy containing any of these metals. Since the first adhesion layer 54 is made of Ta, Ti, Ni or alloy containing one of these metals, it is possible to join the first adhesion layer 54 onto the top face 106c of the p-type semiconductor layer 106 with satisfactory adhesion.

Further, when the first adhesion layer 54 made of Ti, which is comparatively strong metal, is inserted between the metal reflection layer 52 and bonding layer 55, it is possible to improve general strength of the p-type electrode 111.

The first adhesion layer 54 has a maximum thickness of preferably 5 nm to 400 nm, more preferably 20 nm to 300 nm, and still more preferably 40 nm to 200 nm.

When the first adhesion layer 54 has a maximum thickness of 5 nm to 400 nm, it is possible to join the adhesion layer 54 on the top face 106c of the p-type semiconductor layer 106 with satisfactory adhesion. It is not preferable that the maximum thickness be less than 5 nm, since the adhesion strength of the first adhesion layer 54 decreases as well as the strength of the first adhesion layer 54 itself.

As shown in FIG. 5, at the outer peripheral part of the first adhesion layer 54, an outer peripheral portion 54d contacting with the top face 106c of the p-type semiconductor 106 is preferably formed. By providing with the outer peripheral part 54d, it becomes possible to strongly adhere the first adhesion layer 54 to the top face 106c of the p-type semiconductor layer 106, so as to improve adhesion of the p-type electrode 111.

In the sectional view of the electrode of FIG. 5, the contact area of the outer peripheral part 54d which contacts with the top face 106c of the p-type semiconductor layer 106 has a width of preferably 2 nm to 20 nm, desirably 3 nm to 10 nm. With this construction, it is possible to prevent moisture and air from penetrating from outside, and thus improving resistance to weather and corrosion.

<Second Anti-Diffusion Layer>

Although not shown in FIG. 5, a layer (hereinafter, second anti-diffusion layer) for preventing the element of the bonding layer 55 from diffusion may be optionally provided between the first adhesion layer 54 and bonding layer 55 in the embodiment of the present invention.

The second anti-diffusion layer is preferably made of Ru, Rh, Pd, Os, Ir, Pt, W, or an alloy containing at least one kind of these metals. The second anti-diffusion layer has a maximum thickness of preferably 50 nm to 300 nm, and more preferably 70 nm to 250 nm. With this construction, it is possible to prevent elements of the bonding layer from diffusing toward the first adhesion layer 54.

<Bonding Layer>

As shown in FIG. 5, the bonding layer 55 is formed to completely cover the first adhesion layer 54 including the outer peripheral part 54d. At the outer peripheral part thereof, it comprises an inclined face 55e wherein a film thickness gradually becomes smaller toward the outer peripheral portion thereof.

That is, the bonding layer 55 is formed to fully cover over the edges of the first adhesion layer 54, i.e. the boundary which defines the outline of the first adhesion layer 54 in a plan view. That is, since the bonding layer 55 is formed to overhang from the outer peripheral portion of the first adhesion layer 54 in a plan view, it is possible that any part of the first adhesion layer 54 is not exposed from the bonding layer 55.

A concave 111c which is recessed portion is formed on the top face of the bonding layer 55. As shown in FIG. 1, the concave 111c has a circular shape in a plan view.

In producing a lamp, the bonding layer 55 exposed in the concave 111c is joined with wiring of a mounting substrate by using a bump of Au or the like.

An inner bottom 111d of the concave 111c preferably has an area slightly larger than the diameter of the bump. For example, the inner bottom 111d of the concave 111c has a diameter of preferably 60 μm to 100 μm. When the inner bottom 111d of the concave 111c has a diameter of more than 100 μm, mounting is easier. However, an area on which the insulation protective film is formed becomes small, and there occurs a problem that the insulation protective film may lose its effect, which results lower reliability of the light-emitting element. On the contrary, when the inner bottom 111d of the concave 111c has a diameter of less than 60 μm, mounting is more difficult, which results lower production yield of the product.

The bonding layer 55 is made of preferably Au, Al or an alloy containing any of these metals, and more preferably Au. When the bonding layer 55 made of Au, Al or an alloy containing any of these metals is used, it is possible to join the bonding layer 55 to the first adhesion layer 54 and the top face 106c of the p-type semiconductor layer 106 with satisfactory adhesion. Also, since Au and Al strongly adhere with Au, which is most likely to be used as a bump, it is possible to join a bump with the bonding layer 55 with satisfactory adhesion in producing a lamp.

The bonding layer 55 has a maximum thickness of preferably 50 nm to 2,000 nm, more preferably 100 to 1,500 nm, and still more preferably 200 nm to 1,000 nm.

When the bonding layer 55 has a maximum thickness of less than 50 nm, adhesion with a bump deteriorates. It is not preferable that the bonding layer 55 have a maximum thickness of more than 2,000 nm, since it brings no particular advantage, and an increase in cost only arises.

<Second Adhesion Layer>

The second adhesion layer 56 is provided optionally. As shown in FIG. 5, the second adhesion layer 56 is formed to completely cover the bonding layer 55 except the concave 111c. At the outer peripheral part thereof, it comprises an inclined face 56e wherein a film thickness gradually becomes smaller toward the outer peripheral portion thereof.

That is, the second adhesion layer 56 is formed to fully cover over the edges of the bonding layer 55, i.e. the boundary which defines the outline of the bonding layer 55 in a plan view. That is, the second adhesion layer 56 overhangs outside of the bonding layer 55 in a plan view. Therefore it is possible that any part of the bonding layer 55 is not exposed from the second adhesion layer 56 except the concave 111c.

The second adhesion layer 56 is preferably made of Ti, Ta, Ni or an alloy containing any of these metals. When the second adhesion layer 56 is made of Ti, Ta, Ni or an alloy containing any of these metals, it is possible to join the bonding layer 55 with the insulation protective film 10 with satisfactory adhesion.

The second adhesion layer 56 has a maximum thickness of preferably 5 nm to 400 nm, more preferably 5 nm to 300 nm, and still more preferably 7 nm to 100 nm.

It is not preferable that the maximum thickness be less than 5 nm, since junction strength of the second adhesion layer 56 deteriorates.

<Insulation Protective Film>

As shown in FIG. 5, the insulation protective film 10, which is made of silicon oxide such as $SiO_2$, is formed to completely cover the second adhesion layer 56 except the concave 111c. Also, as shown in FIG. 2, the insulation protective film 10 is formed to completely cover a part of the top face 106c of the p-type semiconductor layer 106, the side face which are exposed by partially etching the laminated semiconductor 20 for forming the n-type electrode 108, the exposed face 104c of the n-type semiconductor layer 104, and the side face of the n-type semiconductor 108. The insulation protective film 10 may cover a part of the top face of the n-type electrode such as the outer peripheral part thereof, as well as the side face thereof.

With this construction, it is possible to shield the semiconductor light-emitting element 1 except the concave 111c of the p-type electrode 111 and the top face of the n-type electrode 108 so as to greatly reduce possibility of air and moisture penetrating from outside into the semiconductor light-emitting element 1, and thus to contribute preventing the p-type electrode 111 and n-type electrode 108 of the semiconductor light-emitting element 1 from corrosion.

The insulation protective film 10 has a thickness of preferably 50 nm to 1,000 nm, more preferably 100 nm to 500 nm, and still more preferably 150 nm to 450 nm.

When the insulation protective film 10 has a thickness of 50 nm to 1,000 nm, it is possible to remarkably reduce possibility of air and moisture penetrating from outside into the semiconductor light-emitting element 1, and thus to prevent the p-type electrode 111 and n-type electrode 108 of the semiconductor light-emitting element 1 from corrosion.

In the present embodiment, the p-type electrode 111 is arranged at an axisymmetrical position to the n-type electrode 108 on the approximately rectangular substrate in a plan view. However, the position of the p-type electrode 111 is not limited thereto. The p-type electrode may be formed anywhere on the top face 106c of the p-type semiconductor 106.

The metal element used in the different layers of the p-type electrode 111 may be the same, or different from each other.

<N-Type Electrode>

As shown in FIG. 2, the n-type electrode 108 is formed on the exposed face 104c of the n-type semiconductor layer 104. In forming the n-type electrode 108 as above, a part of the light-emitting layer 105 and p-type semiconductor layer 106 is removed by means of etching or the like, so that the n-contact layer of the n-type semiconductor layer 104 is exposed. The n-type electrode 108 is then formed onto this exposed face 104c. As described above, the n-type electrode 108 is covered with the insulation protective film 10 except the top face of the n-type electrode 108.

As shown in FIG. 1, the n-type electrode 108 has a circular shape in a plan view. However, there is no particular limitation on the shape thereof, and the shape may be any shape such as polygonal shape.

The n-type electrode 108 also serves as a bonding pad. The n-type electrode 108 may have any known composition and structure, and may be provided by common techniques well-known in the art.

Although not shown in the present invention, it is also possible to employ the n-type electrode 108 of the semiconductor light-emitting element 1 which has the same constitution as the p-type electrode 111.

As with the p-type electrode 111, the n-type electrode 108 may have an inclined face wherein a film thickness gradually becomes smaller toward the outer peripheral portion thereof, and may have a multi-layer structure composed of the ohmic contact layer 51, first adhesion layer 54, bonding layer 55 and second adhesion layer 56.

With this construction, it is possible to prevent air and moisture from penetrating from outside into the interface of the n-type electrode 108 and semiconductor layer 104 so as to improve corrosion resistance of the n-type electrode 108, and thus to prevent the n-type electrode 108 of the semiconductor light-emitting element 1 from peeling off.

<Light Emitting Mechanism>

As shown in FIG. 2, the semiconductor light-emitting element 1, which is the embodiment of the present invention, is energized by applying voltage between the p-type electrode 111 and n-type electrode 108, so as to obtain light emission from the light-emitting layer 105, and the light is extracted in the direction f of the substrate 101. Light toward the p-type electrode 111 from the light-emitting layer 105 is reflected on the metal reflection layer 52, and is also extracted in the direction f of the substrate 101 while a part of the light is diffused in a transverse or diagonal direction.

(Method for Producing Semiconductor Light Emitting Element)

Next, an example of the method for producing a semiconductor light-emitting element, which is an embodiment of the present invention, will be described.

The method for producing the semiconductor light-emitting element, which is the embodiment of the present invention, comprises the steps of: forming a laminated semiconductor layer by laminating an n-type semiconductor layer, a light-emitting layer and a p-type semiconductor layer in this order (hereinafter, laminated semiconductor layer forming step); and forming one electrode on the p-type semiconductor layer as well as cutting away a part of the laminated semiconductor layer to expose a part of the n-type semiconductor layer and subsequently forming the other electrode on the exposed face (hereinafter, electrodes forming step).

<Laminated Semiconductor Layer Forming Step>

First, a substrate 101 such as sapphire substrate is prepared, and a buffer layer 102 is laminated onto the top face of the substrate 101 by a sputtering method. The substrate 101 may be subjected to a pretreatment of exposing it to plasma of Ar or $N_2$ in a chamber to wash the top face.

When the buffer layer 102 having a single crystal structure is formed by a sputtering method, it is desirable that the ratio of flow rate of nitrogen to flow rate of nitrogen source and inert gas in a chamber is 50 to 100%, desirably about 75%.

The buffer layer 102 may be formed not only by a sputtering method as described above but also by known an MOCVD method.

Next, a single crystal base layer 103 is formed onto the buffer layer 102.

The base layer 103 is desirably deposited by a sputtering method or an MOCVD method. When a sputtering method is employed, it is possible to make the device simpler compared to an MOCVD method, an MBE method and the like.

The temperature of substrate 101 in depositing the base layer 103, i.e. growth temperature of the base layer 103, is preferably 800° C. or higher, more preferably 900° C. or higher, and most preferably 1,000° C. or higher. The temperature of the substrate 101 in depositing the base layer 103 is preferably lower than 1,200° C., since it needs to be lower than the decomposition temperature of the crystal. When the temperature of the substrate 101 in depositing the base layer 103 is within the above temperature range, it is possible to obtain the base layer 103 having satisfactory crystallinity.

Next, an n-contact layer 104a and n-clad layer 104b are laminated onto the base layer 103, so that an n-type semiconductor layer 104 is formed. For example, a sputtering method or an MOCVD method is used.

Next, a light-emitting layer 105 is formed on the n-type semiconductor layer 104. A sputtering method and an MOCVD method are preferably employed, an MOCVD method is more preferably employed.

Specifically, barrier layers 105a and well layers 105b are alternately and repeatedly laminated, so that the barrier layers 105a exist at the sides where the n-type semiconductor layer 104 and p-type semiconductor layer 106 are provided.

Next, the p-type semiconductor layer 106 is formed onto the light-emitting layer 105. For example, a sputtering method or an MOCVD method is employed. Specifically, a p-clad layer 106a and p-contact layer 106b may be sequentially laminated.

<Electrode Forming Step>

The electrode forming step is to form one electrode (p-type electrode) onto the p-type semiconductor layer 106 (a p-type electrode forming step), and also is to remove a part of the laminated semiconductor layer 20 to expose a part of the n-type semiconductor layer 104 and then to form the other electrode (n-type electrode) onto the exposed face 104c (an n-type electrode forming step).

Either step of the n- and p-type electrode forming steps may be performed first.

<N-Type Electrode Forming Step>

First, patterning is given by known techniques of photolithography, and a part of the laminated semiconductor layer 20 is etched in a predetermined area so that a part of the n-contact layer 104a is exposed.

Next, an n-type electrode 108 is formed on the exposed face 104c of the re-contact layer 104a by a sputtering method or the like.

<P-Type Electrode Forming Step>

The p-type electrode forming step comprises the steps of: forming a first mask having a first opening onto the p-type semiconductor layer and laminating an ohmic contact layer, a metal reflection layer and a first anti-diffusion layer in this order onto the p-type semiconductor layer exposed from the first opening (hereinafter, a first step); and forming a second mask having an opening larger than the first opening onto the p-type semiconductor layer after removing the first mask, and forming a first adhesion layer which covers the first anti-diffusion layer exposed from the opening, followed by laminating a bonding layer, a second adhesion layer and a protective layer in this order (hereinafter, a second step).

The p-type electrode forming step will be described with sectional process views shown in FIGS. 6A to 9.

<First Step>

Figure 6A:
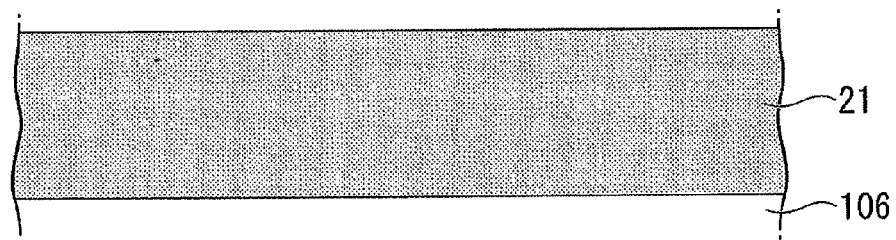
FIG. 6A is a cross-sectional view showing an example process of the p-type electrode of the light-emitting element of the present invention.

First, as shown in FIG. 6A, resist is applied onto the top face 106c of the p-type semiconductor layer 106. The resist is dried to be an insoluble resist 21. The resist may be selected optionally. For example, AZ5200NJ (product name, manufactured by AZ Electronic Materials Co., Ltd) and the like may be used.

Next, an approximately rectangular mask (hereinafter, first p-type electrode forming mask) having side lengths of $l_1 \times l_2$ is placed in front of the resist 21 so as to cover the position where the p-type electrode is to be formed.

Figure 6B:
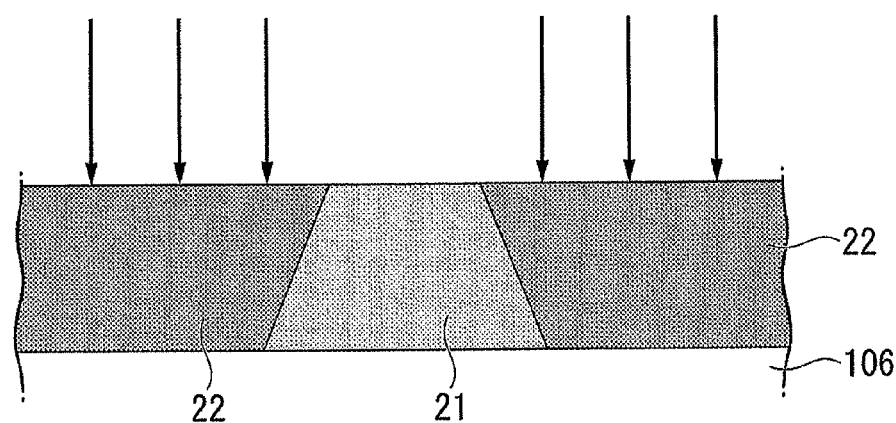
FIG. 6B is a cross-sectional view showing an example process of the p-type electrode of the light-emitting element of the present invention.

Next, light having a predetermined intensity and wavelength is applied as shown by the arrows, so as to expose the part of the resist 21 which is not covered with the mask 25 (partial exposure). The exposed resist 21 becomes a first soluble resist 22 by photoreaction as shown in FIG. 6B. Since the photoreaction proceeds according to the light intensity, it proceeds fast on the side irradiated with the light while it proceeds slowly on the side of the p-type semiconductor layer 106.

As a result, the first soluble resist 22 is formed so that the side face is an inverted slope which retracts, i.e. expands inward as it goes down as shown in FIG. 6B. The side face forms an inverse tapered shape.

On the contrary, the insoluble resist 21 at the masked part is formed so that the side face is a slope which expands outward, or stretches as it goes down. The side face forms a tapered shape.

Figure 6C:
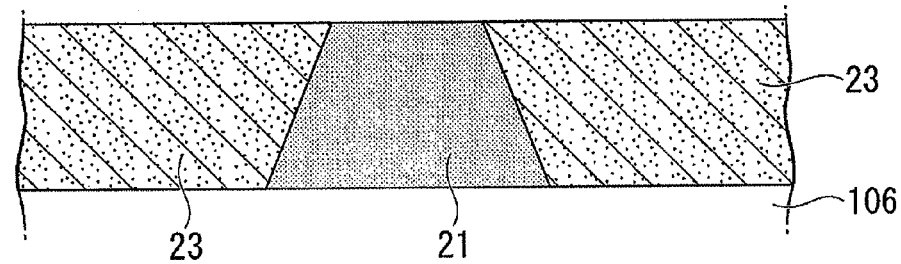
FIG. 6C is a cross-sectional view showing an example process of the p-type electrode of the light-emitting element of the present invention.

Next, the substrate 101 on which the first soluble resist 22 is formed is heated with, for example, a hot plate or oven. By thermal reaction due to the heat, the first soluble resist 22 is crosslinked to be a cured resist 23 of crosslinked polymer as shown in FIG. 6C. The insoluble resist 21 is not crosslinked or cured by the heat.

Figure 6D:
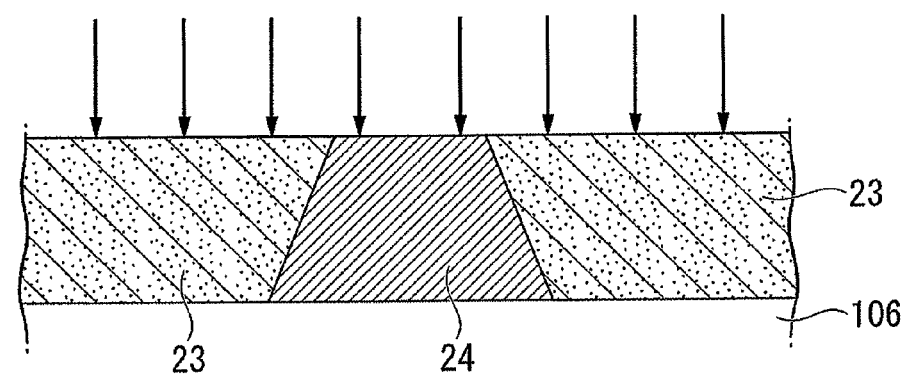
FIG. 6D is a cross-sectional view showing an example process of the p-type electrode of the light-emitting element of the present invention.

Next, light having a predetermined intensity and wavelength is applied without a mask as shown by the arrows in FIG. 6D (full exposure). As a result, the insoluble resist 21, which is not exposed by the partial exposure, becomes a second soluble resist 24.

Figure 7A:
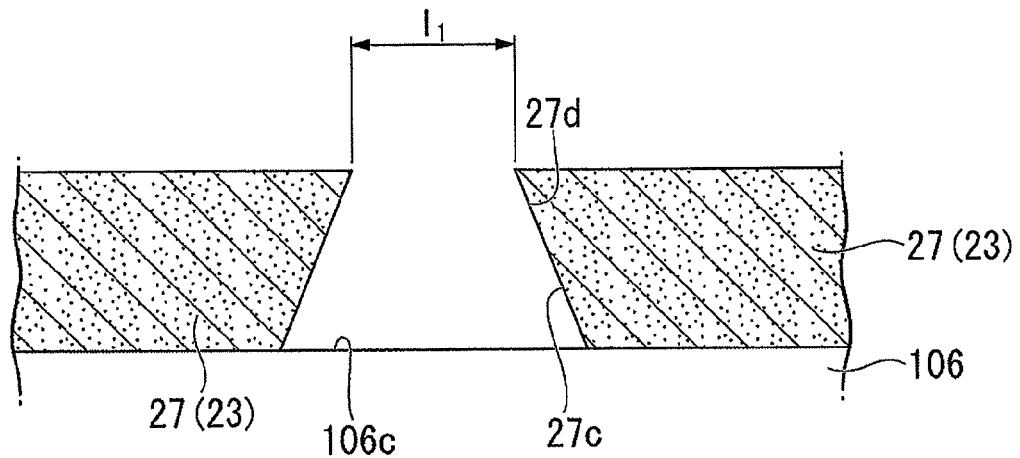
FIG. 7A is a cross-sectional view showing an example process of the p-type electrode of the light-emitting element of the present invention.

Next, the second soluble resist 24 is dissolved and removed by use of predetermined organic solvent. The above-described cured resist 23 is insoluble in the organic solvent. As a result, the cured resist 23 of crosslinked polymer is left as shown in FIG. 7A. The cured resist 23 comprises a first opening 27c having a width of $l_1$ where a part of the top face 106c of the p-type semiconductor layer 106 is exposed. The first opening 27c has an approximately rectangular shape having side lengths of $l_1 \times l_2$ when visually viewed from upward. The side face (inner wall) 27d of the first opening 27c is an inversed slope (inverse tapered shape) which retracts as it goes down. The first opening 27c has a transverse sectional area increasing toward the p-type semiconductor layer 106. The side face (inner wall) 27d of the first opening 27c has an almost constant inclination angle. This is named a first mask 27.

Next, an ohmic contact layer 51 is formed onto the top face 106c of the p-type semiconductor layer 106 by a sputtering method through the first mask 27.

Figure 7B:
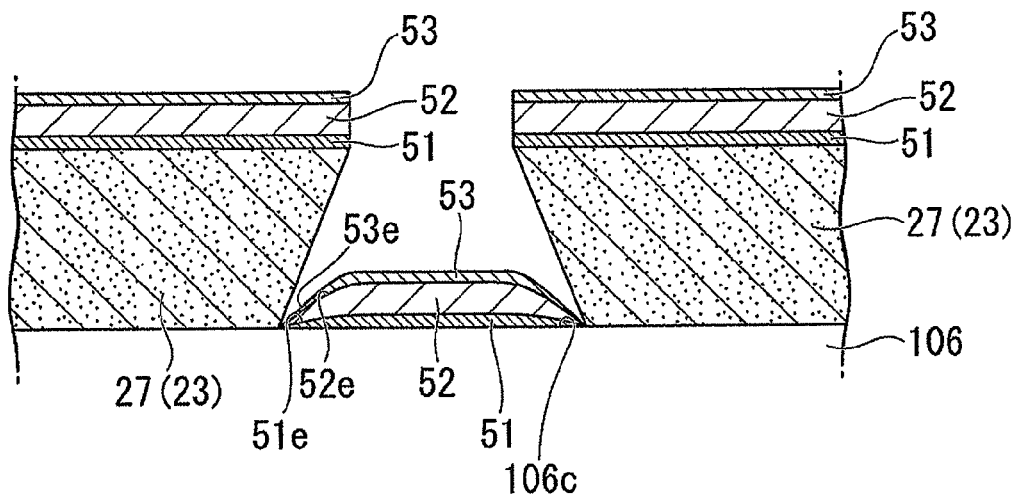
FIG. 7B is a cross-sectional view showing an example process of the p-type electrode of the light-emitting element of the present invention.

In depositing the ohmic contact layer 51, the ohmic contact layer 51 is formed to cover a slightly larger area than side lengths $l_1$ and $l_2$ of the first opening 27c of the first mask 27. Specifically, the ohmic contact layer 51 spreads to the vicinity of the inner wall 27d of the mask 27 on the top face 106c of the p-type semiconductor layer 106. That is, since the first mask 27 has the construction that the inner wall 27d of the first opening 27c retracts as it goes down, i.e. expands downward, a shadow is formed when viewed from a direction of sputtering. As shown in FIG. 7B, an inclined face 51e wherein a film thickness gradually becomes smaller toward the outer peripheral portion is thus formed under the outer peripheral portion of the mask, i.e. at the outer peripheral part of the ohmic contact layer 51. The inclination angle of the inclined face 51e depends on the film thickness.

Next, a metal reflection layer 52 is formed onto the ohmic contact layer 51 by a sputtering method through the first mask 27.

To deposit the metal reflection layer 52, a sputtering method is employed as with the ohmic contact layer 51. The metal reflection layer 52 is therefore formed to spread slightly wider than the side lengths $l_1$ and $l_2$ of the first opening 27c of the first mask 27, i.e. to spread to the vicinity of the inner wall 27d of the first mask 27 on the top face 106c of the p-type semiconductor layer 106. Since the first mask 27 has the construction that the inner wall 27d of the first opening 27c retracts as it goes down, an inclined face 52e wherein a film thickness gradually becomes smaller toward the outer peripheral portion is formed at the shadowed area which is hidden when viewed from a direction of sputtering, i.e. at the outer edge part of the metal reflection layer 52, as shown in FIG. 7B. The inclination angle of the inclined face 52e depends on the film thickness.

The metal reflection layer 52 is formed to completely cover the ohmic contact layer 51.

Next, a first anti-diffusion layer 53 is formed onto the metal reflection layer 52 by a sputtering method through the first mask 27.

To depositing the first anti-diffusion layer 53, a sputtering method is employed as with the ohmic contact layer 51. Therefore the first anti-diffusion layer 53 spreads slightly wider than the side lengths $l_1$ and $l_2$ of the first opening 27c of the first mask 27, i.e. to spread to the vicinity of the inner wall 27d of the first mask 27 on the top face 106c of the p-type semiconductor layer 106. Since the first mask 27 has the construction that the inner wall 27d of the first opening 27c retracts as it goes down, an inclined face 53e wherein a film thickness gradually becomes smaller toward the outer peripheral portion is formed at the shadowed area using a sputtering method, i.e. at the outer edge part of the first anti-diffusion layer 53 as shown in FIG. 7B. The inclination angle of the inclined face 53e depends on the film thickness.

The first anti-diffusion layer 53 is formed to fully cover the metal reflection layer 52.

Figure 7C:
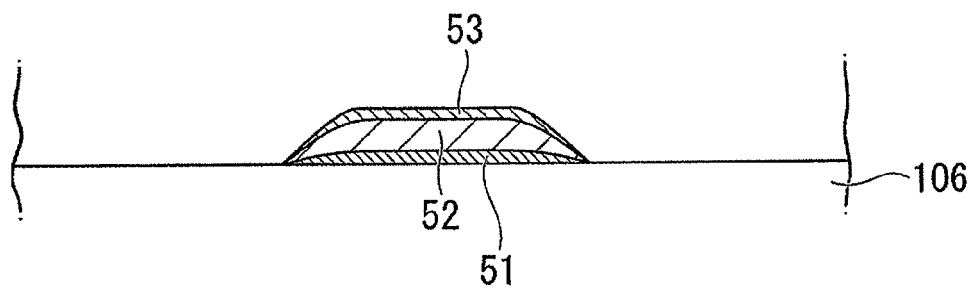
FIG. 7C is a cross-sectional view showing an example process of the p-type electrode of the light-emitting element of the present invention.

Next, the first mask 27 is removed by use of resist stripper or the like, so that a 3-layered structure composed of the ohmic contact layer 51, metal reflection layer 52 and first anti-diffusion layer 53 is only left on the top face 106c of the p-type semiconductor layer 106 as shown in FIG. 7C.

Prior to forming the metal reflection layer 52, a pretreatment may be subjected to clean the surface of the ohmic contact layer 51. As for the method of cleaning, there can be given a dry process of exposing to plasma and the like and a wet process by contact with chemicals. From the viewpoint of ease of the process, a dry process is desirable.

<Second Step>

Figure 8A:
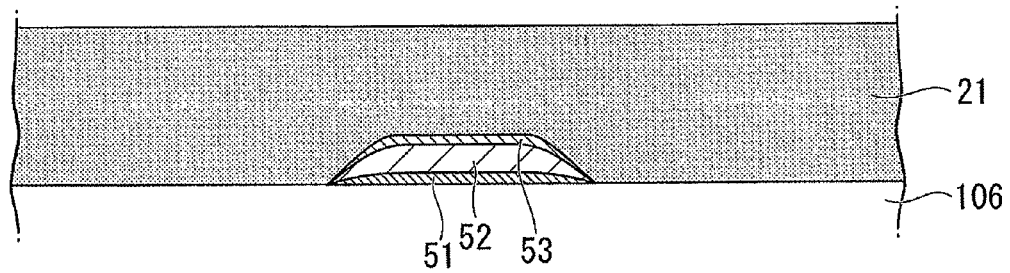
FIG. 8A is a cross-sectional view showing an example process of the p-type electrode of the light-emitting element of the present invention.

Next, as shown in FIG. 8A, resist is applied to cover the 3-layered structure composed of the ohmic contact layer 51, metal reflection layer 52 and first anti-diffusion layer 53, as well as the top face 106c of the p-type semiconductor layer 106. The resist is converted into an insoluble resist 21 by drying.

Figure 8B:
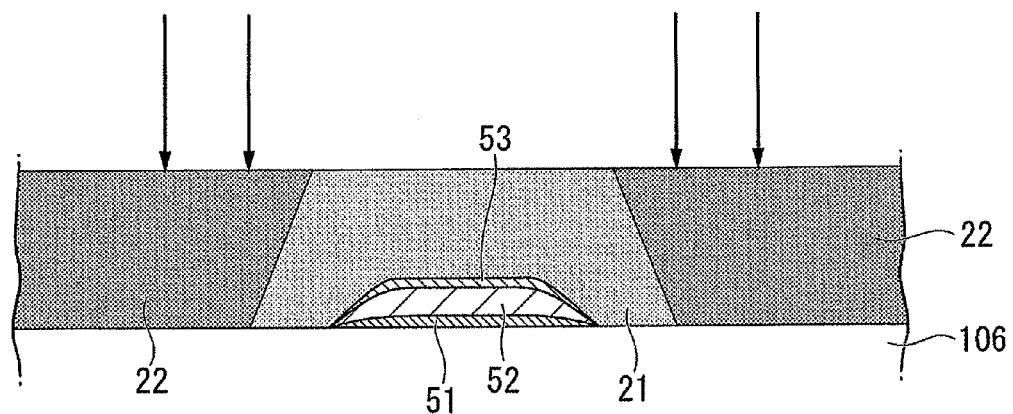
FIG. 8B is a cross-sectional view showing an example process of the p-type electrode of the light-emitting element of the present invention.

Next, as shown in FIG. 8B, an approximately rectangular mask (hereinafter, second p-type electrode forming mask) having side lengths of $l_3 \times l_4$ which are respectively longer than the first p-type electrode forming mask used in the first step is placed in front of the resist 21, so as to cover the area where the electrode is to be formed.

Next, light having a predetermined intensity and wavelength is applied as shown by the arrows to photoreact (partially expose) the exposed part of the resist 21, so as to form a first soluble resist 22 as shown in FIG. 8B. Since the photoreaction proceeds according to the light intensity, it proceeds fast on the side irradiated with the light while it proceeds slowly on the side of the p-type semiconductor layer 106.

As a result, the first soluble resist 22 is formed so that the side face is an inverted slope (invert tapered shape) which retracts as it goes down as shown in FIG. 8B.

On the contrary, the insoluble resist 21 at the masked part is formed so that the side face is a slope (tapered shape) which stretches as it goes down.

Figure 8C:
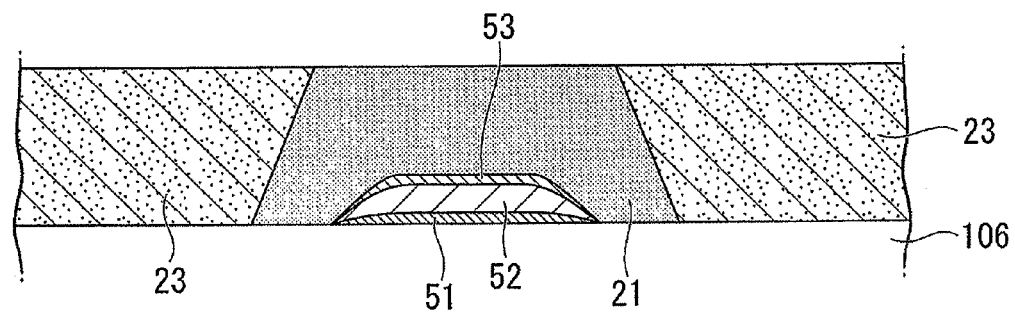
FIG. 8C is a cross-sectional view showing an example process of the p-type electrode of the light-emitting element of the present invention.

Next, the substrate 101 on which the first soluble resist 22 is formed is heated with, for example, a hot plate or oven. By thermal reaction due to the heat, the first soluble resist 22 is crosslinked to be a cured resist 23 of crosslinked polymer as shown in FIG. 8C.

Figure 8D:
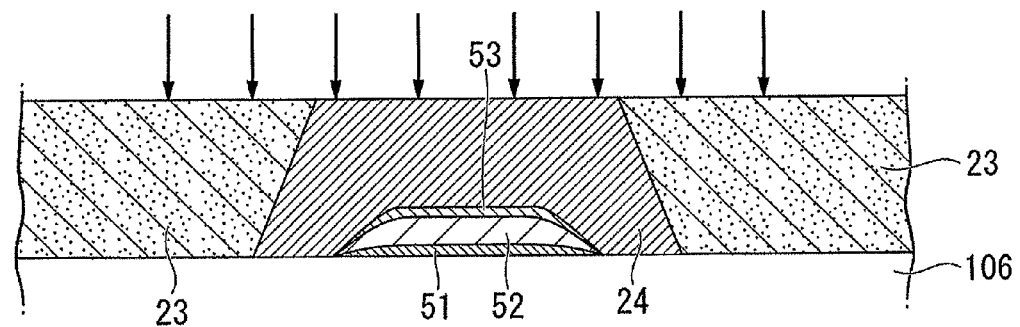
FIG. 8D is a cross-sectional view showing an example process of the p-type electrode of the light-emitting element of the present invention.

Next, light having a predetermined intensity and wavelength is applied without the mask as shown by the arrows in FIG. 8D (full exposure). As a result, the insoluble resist 21, which is not exposed by the partial exposure, becomes a second soluble resist 24.

Figure 9A:
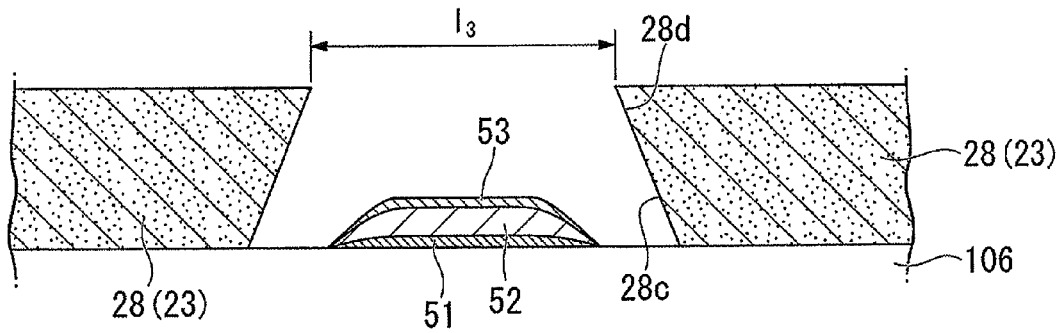
FIG. 9A is a cross-sectional view showing an example process of the p-type electrode of the light-emitting element of the present invention.

Next, the second soluble resist 24 is dissolved and removed by use of predetermined organic solvent. The above-described cured resist 23 is insoluble in the organic solvent. As a result, the cured resist 23 of crosslinked polymer is left as shown in FIG. 9A. The cured resist 23 comprises a second opening 28c having a width of $l_3$ where a part of the top face 106c of the p-type semiconductor layer 106 is exposed. The second opening 28c has an approximately rectangular shape having side lengths of $l_3 \times l_4$ when visually viewed from upward. The side face (inner wall) of the second opening 28c is an inversed slope (inverse tapered shape) which retracts as it goes down. The second opening 28c has a transverse sectional area increasing toward the p-type semiconductor layer 106. The side face (inner wall) 28d of the second opening 28c has an almost constant inclination angle. This is named a second mask 28.

Next, a first adhesion layer 54 is formed onto a first anti-diffusion layer 53 by a sputtering method through the second mask 28.

Figure 9B:
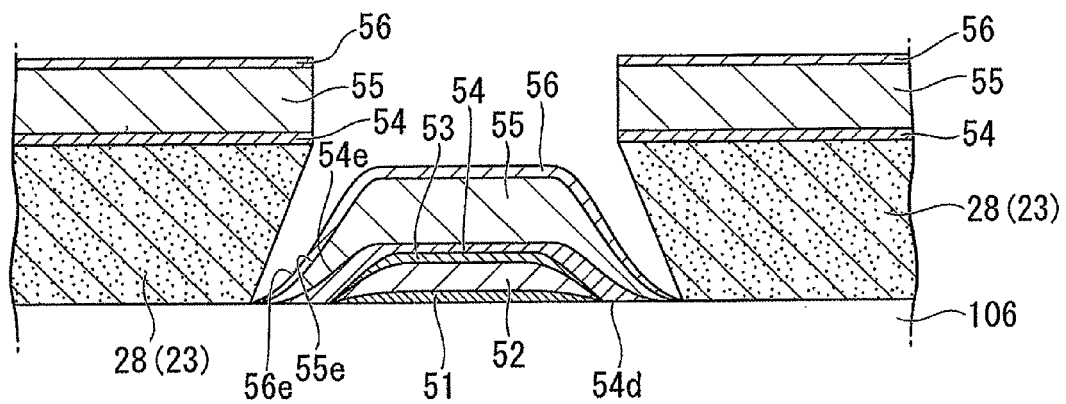
FIG. 9B is a cross-sectional view showing an example process of the p-type electrode of the light-emitting element of the present invention.

In depositing the first adhesion layer 54, the first adhesion layer 54 is formed to cover an area a little bit wider than the side lengths $l_3$ and $l_4$ of the second opening 28c of the second mask 28. Specifically, the first adhesion layer 54 is formed to spread to the vicinity of the inner wall 28d of the second mask 28 on the top face 106c of the p-type semiconductor 106. The second mask 28 has the construction that the inner wall 28d of the second opening 28c retracts as it goes down, i.e. expands downward, a shadow is formed when viewed in a direction of the sputtering. As shown in FIG. 9B, an inclined face 54e wherein a film thickness gradually becomes smaller toward the outer peripheral portion is thus formed under the rim of the mask, i.e. at the outer peripheral part of the first adhesion layer 54. The inclined angle of the inclined face 54e depends on the film thickness.

The side lengths $l_3$ and $l_4$ of the second opening 28c of the second mask 28 are longer than the side lengths $l_1$ and $l_2$ of the first opening 27c of the first mask 27 respectively. An outer peripheral part 54d which is in contact with the p-type semiconductor layer 106 is therefore formed at the outer peripheral part of the first adhesion layer 54, as well as it completely covers the first anti-diffusion layer 53. When the outer peripheral part 54d as above is formed, it is possible to join the first adhesion layer 54 with the p-type semiconductor layer 106 with satisfactory adhesion.

Next, a bonding layer 55 is formed onto the first adhesion layer 54 by a sputtering method through the second mask 28.

In depositing the bonding layer 55, a sputtering method is employed as with the first adhesion layer 54. Therefore the bonding layer 55 is formed to spread slightly wider than the side lengths $l_3$ and $l_4$ of the second opening 28c of the second mask 28, i.e. to spread to the vicinity of the inner wall 28d of the second mask 28 on the top face 106c of the p-type semiconductor layer 106. Since the second mask 28 has the construction that the inner wall 28d of the second opening 28c retracts as it goes down, an inclined face 55e wherein a film thickness gradually becomes smaller toward the outer peripheral portion is formed at the shadowed area which is formed when viewed from a direction of sputtering, i.e. at the outer edge part of the bonding layer 55 as shown in FIG. 9B. The inclination angle of the inclined face 55e depends on the film thickness.

The bonding layer 55 is formed to completely cover the first adhesion layer 54.

Next, a second adhesion layer 56 is formed onto the bonding layer 55 by a sputtering method through the second mask 28.

In depositing the second adhesion layer 56, a sputtering method is employed as with the bonding layer 55. Therefore the second adhesion layer 56 is formed to spread slightly wider than the side lengths $l_3$ and $l_4$ of the second opening 28c of the second mask 28, i.e. to spread to the vicinity of the inner wall 28d of the second mask 28 on the top face 106c of the p-type semiconductor layer 106. Since the second mask 28 has the construction that the inner wall 28d of the second opening 28c retracts as it goes down, an inclined face 56e wherein a film thickness gradually becomes smaller toward the outer peripheral portion is formed at the shadowed area which is formed when viewed from a direction of sputtering, i.e. at the outer peripheral part of the second adhesion layer 56 as shown in FIG. 9B. The inclination angle of the inclined face 56e depends on the film thickness.

The second adhesion layer 56 is formed to completely cover the bonding layer 55.

Figure 9C:
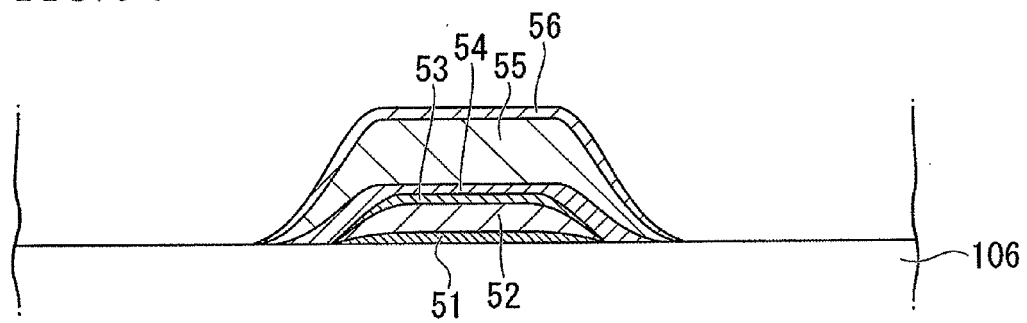
FIG. 9C is a cross-sectional view showing an example process of the p-type electrode of the light-emitting element of the present invention.

Next, as shown in FIG. 9C, the second mask 28 is removed by use of resist stripper or the like, so that a 6-layered structure composed of the ohmic contact layer 51, metal reflection layer 52, first anti-diffusion layer 53, first adhesion layer 54, bonding layer 55 and second adhesion layer 56 is formed on the top face 106c of the p-type semiconductor 106.

Further, an n-type electrode 108 is formed. As for the production method thereof, a process using the first mask 27 and second mask 28 may be optionally applied as with the p-type electrode 111. The n-type electrode 104 may be provided in any step, e.g. before or after the p-type electrode forming step.

Figure 9D:
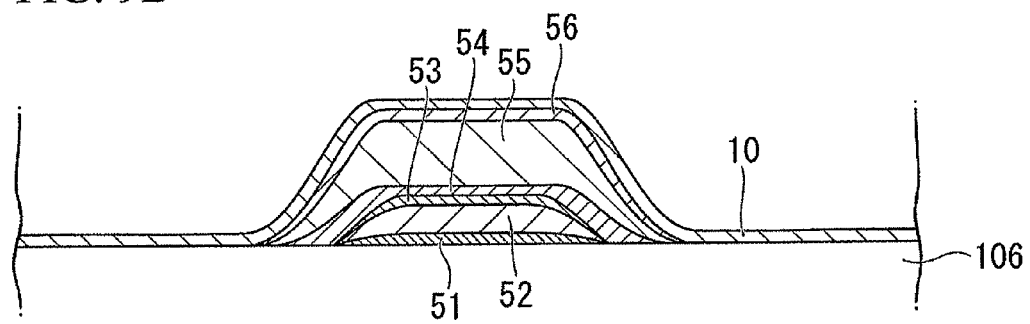
FIG. 9D is a cross-sectional view showing an example process of the p-type electrode of the light-emitting element of the present invention.

Next, as shown in FIG. 9D, an insulation protective film 10 is formed to cover the second adhesion layer 56 and top face 106c of the p-type semiconductor layer 106 by a sputtering method. Herein, the insulation protective film 10 is formed to cover the side face of the p-type semiconductor layer 106 and an exposed face 104c of the n-type semiconductor layer 104 as well.

Next, patterning is given by known techniques of photolithography, and a concave 111c is formed by etching in a predetermined area of the p-type semiconductor 111, so that a part of the bonding layer 55 is exposed. As a result, the p-type electrode 111, in which the ohmic contact layer 51, metal reflection layer 52, first anti-diffusion layer 53, first adhesion layer 54, bonding layer 55, second adhesion layer 56 and insulation protective film 10 are laminated and the concave 111c is provided, is formed on the top face 106c of the p-type semiconductor layer 106.

Next, patterning is given by known techniques of photolithography, so that a top face of the n-type electrode 108 is exposed.

As described above, the semiconductor light-emitting element 1 shown in FIGS. 1 to 5 is produced.

The semiconductor light-emitting element 1, which is the embodiment of the present invention, comprises: the substrate 101; the laminated semiconductor layer 20 in which the n-type semiconductor layer 104, light-emitting layer 105 and p-type semiconductor layer 106 are laminated on the substrate 101 in this order; the one electrode 111 connected with the p-type semiconductor layer 106; and another electrode 108 connected with the n-type semiconductor layer 104, wherein one or both of the one and other electrodes 111 and 108 has a structure such that the ohmic contact layer 51, metal reflection layer 52, first anti-diffusion layer 53 and first adhesion layer 54 are laminated in this order, and the first adhesion layer 54 has the outer peripheral portion 54d which extends so as to be in contact with the laminated semiconductor layer 20, so as to fully cover the first anti-diffusion layer 53. Therefore it is possible to improve adhesion of the electrodes with the laminated semiconductor layer 20, so as to make the electrodes not peeled even by tension stress at the time of joining them with wiring of a mounting substrate. It is also possible to prevent moisture and air from penetrating from outside to the ohmic contact layer 51, so as to extend life of the semiconductor light-emitting element.

The semiconductor light-emitting element 1, which is the embodiment of the present invention, comprises the inclined face 54e at the outer peripheral part 54d of the first adhesion layer 54, wherein a film thickness gradually becomes smaller toward the outer peripheral portion. Therefore it is possible to improve adhesion of the electrode with the laminated semiconductor layer so as to prevent air and moisture from penetrating from outside into the electrode, and thus to extend life of the semiconductor light-emitting element.

In the semiconductor light-emitting element 1, which is the embodiment of the present invention, the ohmic contact layer 51 is made of a transparent conductive material, for example a conductive oxide containing at least one metal selected from the group consisting of In, Zn, Al, Ga, Ti, Bi, Mg, W, Ce, Sn and Ni. Therefore it is possible to allow the light to effectively transmit therethrough, so as to improve the light-emitting characteristics of the semiconductor light-emitting element. It is also possible to prevent the metal constituting the metal reflection layer from diffusing to the ohmic contact layer.

According to the semiconductor light-emitting element 1, which is the embodiment of the present invention, the metal reflection layer 52 is made of any one of Ag, Al, Ru, Rh, Pd, Os, Ir, Pt and Ti, or an alloy containing any of these metals. Therefore it is possible to reflect the light effectively, so as to improve the light-emitting characteristics of the semiconductor light-emitting element.

According to the semiconductor light-emitting element 1, which is the embodiment of the present invention, the first anti-diffusion layer 53 is made of Ta, Ti, Ni or an alloy containing any of these metals. Therefore it is possible to prevent the metal constituting the metal reflection layer 52 from diffusing to the bonding layer.

According to the semiconductor light-emitting element 1, which is the embodiment of the present invention, the first adhesion layer 54 is made of Ta, Ti, Ni or an alloy containing any of these metals. Therefore it is possible to improve adhesion between the first anti-diffusion layer 53 and bonding layer 55, and thus making electrodes which do not undergo deterioration.

According to the semiconductor light-emitting element 1, which is the embodiment of the present invention, the second anti-diffusion layer is formed to cover the first adhesion layer 54. Therefore it is possible to prevent the element of the bonding layer from diffusing to the side of the first adhesion layer 54, and thus making electrodes which do not undergo deterioration.

According to the semiconductor light-emitting element 1, which is the embodiment of the present invention, the second anti-diffusion layer is made of Ru, Rh, Pd, Os, Ir, Pt, W or an alloy containing any of these metals. Therefore it is possible to prevent the element of the bonding layer diffusing to the side of the first adhesion layer 54, and thus making electrodes which do not undergo deterioration.

According to the semiconductor light-emitting element 1, which is the embodiment of the present invention, the bonding layer 55 is formed to cover the first adhesion layer 54 or second anti-diffusion layer. Therefore it is possible to improve adhesion of the electrodes to the laminated semiconductor layer 20, so as to improve production efficiency of the semiconductor light-emitting element as well as to extend life of the semiconductor light-emitting element.

According to the semiconductor light-emitting element 1, which is the embodiment of the present invention, the bonding layer is made of Au, Al or an alloy containing any of these metals. Therefore it is possible to improve jointing of the bonding layer, so as to make the electrodes join rigidly with wiring of a mounting substrate.

According to the semiconductor light-emitting element 1, which is the embodiment of the present invention, the second adhesion layer 56 is formed to cover the bonding layer 55. Therefore it is possible to improve adhesion between the bonding layer 55 and protective film 10, and thus making electrodes which do not undergo deterioration.

According to the semiconductor light-emitting element 1, which is the embodiment of the present invention, the second adhesion layer 56 is made of Ti, Ta, Ni or an alloy containing any of these metals. Therefore it is possible to improve adhesion between the bonding layer 55 and protective film 10, and thus making electrodes which do not undergo deterioration.

According to the semiconductor light-emitting element 1, which is the embodiment of the present invention, the insulation protective film 10 is formed to cover the second adhesion layer 56. Therefore it is possible to improve corrosion resistance of the electrodes, so as to extend life of the semiconductor light-emitting element.

According to the semiconductor light-emitting element 1, which is the embodiment of the present invention, the laminated semiconductor layer 20 is mainly composed of a gallium nitride based semiconductor. Therefore it is possible to improve joining and corrosion resistance of the electrodes, so as to improve light-emitting characteristics of the semiconductor light-emitting element.

The electrode 111 for semiconductor light-emitting element, which is the embodiment of the present invention, comprises: the substrate 101; the laminated semiconductor layer 20 in which an n-type semiconductor layer 104, light-emitting layer 105 and p-type semiconductor layer 106 are laminated on the substrate 101 in this order; the one electrode 111 joined with the p-type semiconductor layer 106; and the other electrode 108 joined with the n-type semiconductor layer 104, wherein one or both of the one and other electrodes 111 and 108 has a structure such that the ohmic contact layer 51, metal reflection layer 52, first anti-diffusion layer 53 and first adhesion layer 54 are laminated in this order, and the first adhesion layer 54 comprises the outer peripheral portion 54d which extends so as to be in contact with the laminated semiconductor layer 20, so as to completely cover the first anti-diffusion layer 53. Therefore it is possible to improve adhesion of the electrode.

According to the electrode 111 for semiconductor light-emitting element, which is the embodiment of the present invention, the first adhesion layer 54 comprises the inclined face 54e on the outer peripheral part 54d, which has a thickness which gradually becomes smaller toward the outer peripheral portion. Therefore it is possible to improve adhesion of the electrode.

The electrode 111 for semiconductor light-emitting element, which is the embodiment of the present invention, has a structure wherein the bonding layer 55 is formed to cover the first adhesion layer 54. Therefore it is possible to improve adhesion of the electrode.

(Second Embodiment)

Figure 10:
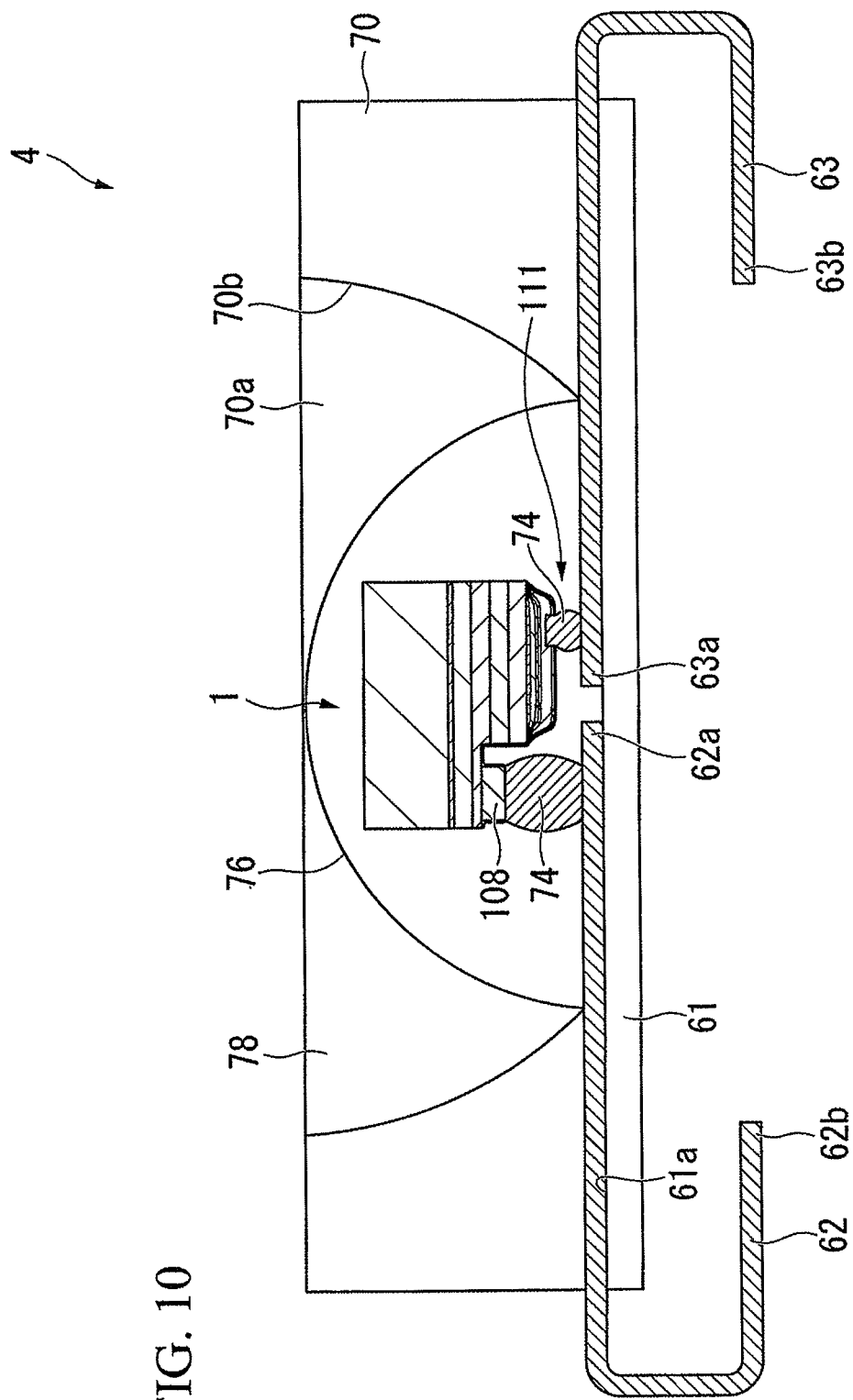
FIG. 10 is a schematic cross-sectional view showing an example of a lamp of the present invention.
Figure 11:
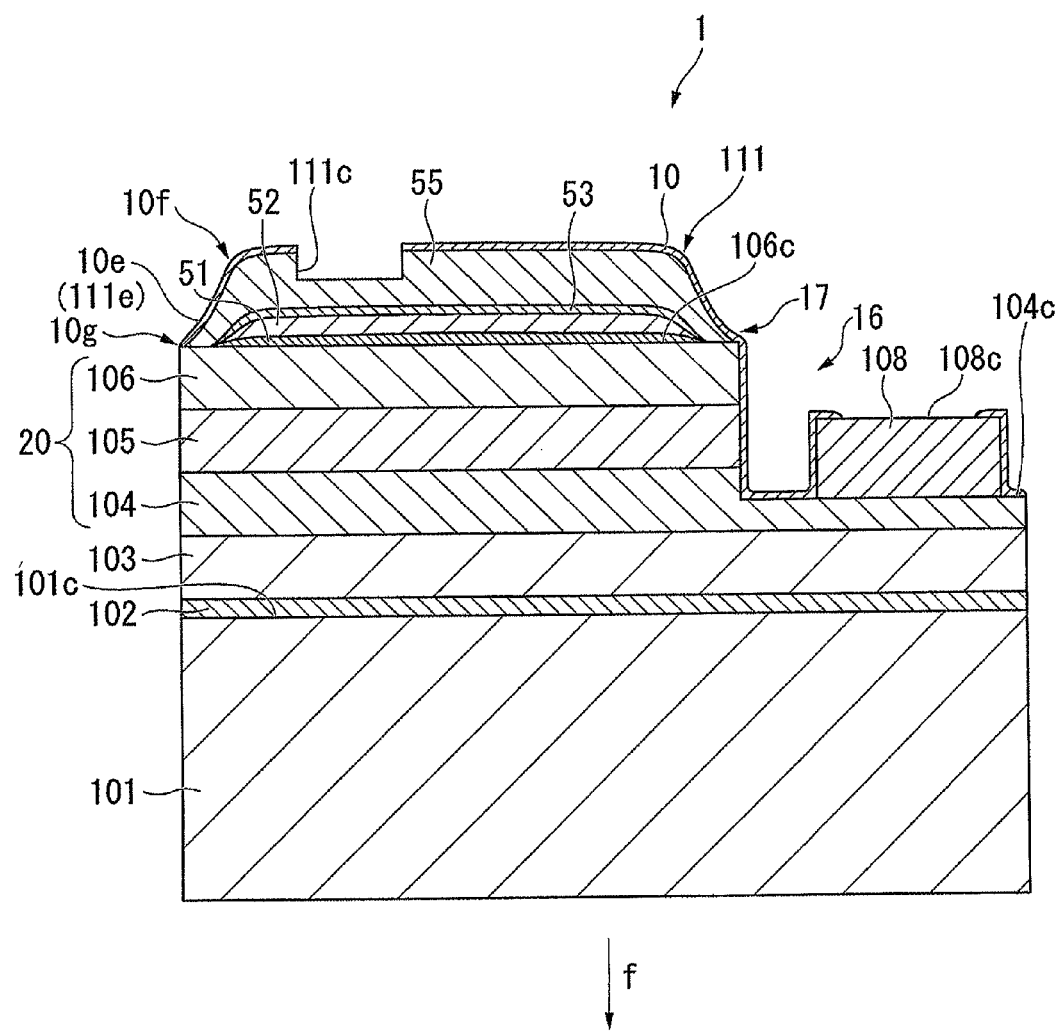
FIG. 11 is a schematic cross-sectional view showing an example of the semiconductor light-emitting element of the present invention.

FIG. 10 is a schematic cross-sectional view showing an example of a lamp, which is an embodiment of the present invention. In the figures referred to in the following description, size, thickness, dimensions and the like of the members shown in the figures do not correspond to the actual dimensions of the semiconductor light-emitting element and the like.

As shown in FIG. 10, a lamp 4 of the embodiment of the present invention is a chip for board mounting, and the semiconductor light-emitting element 1 described in the first embodiment is used therein.

The lamp 4 is, for example, a combination of the semiconductor light-emitting element 1 and a phosphor, and may have any constitution known in the art and may be produced by means known in the art. It is known that emission color can be changed by the combination of the semiconductor light-emitting element 1 and phosphor, and it is not limited at all to employ such techniques in the embodiment lamp of the present invention.

In the lamp 4 according to the embodiment of the present invention, one wiring portion 63 and the other wiring portion 62 each made of a lead wire and the like are provided on one face 61*a* of a mounting substrate 61 of white alumina ceramics having a high reflectivity of visible light, one ends 62*a* and 63*a* thereof are positioned approximately at the center of the mounting substrate 61, and other ends 62*b* and 63*b* are drawn outside to be electrodes which are to be soldered in mounting onto an electric board.

The semiconductor light-emitting element 1 is arranged so that one electrode (p-type electrode) 111 and another electrode (n-type electrode) 108 face with the one face 61*a* of the mounting substrate 61. That is, the semiconductor light-emitting element 1 is arranged so that the side of the substrate 101 does not face with the mounting substrate 61, i.e. faces the opposite side (flip-chip arrangement). Light from the semiconductor light-emitting element 1 is therefore emitted mainly in a direction from the mounting substrate to substrate 101.

The p- and n-type electrodes 111 and 108 of the semiconductor light-emitting element 1 are joined respectively with the one end 62*a* of the other wiring 62 and the one end 63*a* of the one wiring portion 63 through bumps 74 made of Au or the like. As a result, the p-type electrode 111 of the semiconductor light-emitting element 1 is electrically connected with the one wiring portion 63, and the n-type electrode 108 is electrically connected with the other wiring 62.

A rectangular parallelepipedic wall member 70 is fixed on the board 61. A cup-shaped hole 70*a* for housing the semiconductor light-emitting element 1 is formed at the center part of the wall member 70. An inclined face 70*b* of the hole 70*a* is constituted by a white or metallic face having a high reflectivity of visible light, and the curved shape thereof is determined according to reflection direction of the light so as to be a reflecting surface (reflector face) for extracting the light forward.

The semiconductor light-emitting element 1 arranged inside the hole 70*a* is covered with a dome-shaped transparent sealing resin (mold) 76. Further, another transparent sealing resin (mold) 78 fills the hole 70*a* so as to cover the sealing resin 76.

Arbitrary resin is selected as the sealing resins 76 and 78. For example, transparent materials such as silicone resin having a high heat resistance, polycarbonate resin, other resins such as epoxy resin and glass are used. The sealing resins 76 and 78 may be the same or different resins. From the viewpoint of ease of production and satisfactory adhesion, it is preferable to use the same resin. A phosphor may be dispersed in the sealing resins 76 and 78. With this construction, it is possible to make various emission colors, or to improve color rendering properties when white light is emitted.

The mounting substrate 61 and/or wall member 70 is a resin or ceramic member, or the like. With this construction, it is possible to reduce the production cost, or to obtain superior heat resistance. As for the resin, for example, nylon resin having a high heat resistance and reflectivity, white silicone resin and the like are used. Alternatively, a printed-wiring glass epoxy board (hereinafter, wiring board) may be used as the mounting substrate 61, in which the semiconductor light-emitting element 1 is directly mounted on the wiring board to be a chip-on-board device.

The lamp 4, which is the embodiment of the present invention, may be used for any purpose such as backlight of cellphones as a side-view type and indicators as a top-view type.

The lamp 4, which is the embodiment of the present invention, comprises: the mounting substrate 61 comprising the one wiring portion 63 and other wiring 62 on an one face, the other wiring 62 being arranged separately from the one wiring portion 63; and the semiconductor light-emitting element 1 according to any one of (1) to (14) arranged on one face 61*a* of the mounting substrate 61, wherein the one electrode 111 of the semiconductor light-emitting element 1 is connected with the one wiring portion 63, the other electrode 108 of the semiconductor light-emitting element 1 is connected with the other wiring 62, and the substrate 101 of the semiconductor light-emitting element 1 is arranged to be on an opposite side to the mounting substrate 61. The p-type electrode 111 is therefore joined with the laminated semiconductor layer 20 with satisfactory adhesion, and thus the p-type electrode 111 does not peel off when it is joined with the wiring 63. Therefore it is possible that the lamp comprising the semiconductor light-emitting element 1 has long life.

The semiconductor light-emitting element 1 and lamp 4, which are the embodiments of the present invention, may be installed in, for example, a lighting device for use. In this case, although not shown by a figure, they can be applied to, for example, a lighting device comprising: a board on which wiring and through holes are formed; a lamp using a plurality of semiconductor light-emitting elements attached onto a board surface; and a reflector or shade having a concave shape in a cross section in which the lamp using the semiconductor light-emitting elements is attached on the bottom of the concave. The lamp using the semiconductor light-emitting element described as the examples may be fixed in a reflector for lighting device according to the description of JP-A-2008-16412, and a lighting device comprising a plurality of the reflectors may be thus produced as the embodiment of the present invention.

The lamp 4, which is the embodiment of the present invention, may be applied to electronic equipment such as cell phones, displays and panels, and to mechanical devices equipped with such electronic equipment such as cars, computers and game machines.

The present invention will be specifically described below by way of examples. However, the present invention is not intended to be limited to these examples.

EXAMPLES

Example 1

<Preparation of Semiconductor Light Emitting Element>

A semiconductor light-emitting element of gallium nitride-based compound semiconductor described in the first embodiment was produced as follows.

First, a base layer of undoped GaN having 8 μm thickness was formed onto a sapphire substrate via a buffer layer of AlN.

Next, after an Si doped n-type GaN contact layer having 2 µm thickness and an n-type $In_{0.1}Ga_{0.9}N$ clad layer having 250 nm thickness was formed, Si doped GaN barrier layers of 16 nm thickness and $In_{0.2}Ga_{0.8}N$ well layers of 2.5 nm thickness were laminated alternately respectively for 5 times and further finished with the barrier layer, so that a light-emitting layer having a multiple quantum well structure was formed.

Further, an Mg doped p-type $Al_{0.07}Ga_{0.93}N$ clad layer having a thickness of 10 nm and an Mg doped p-type GaN contact layer having a thickness of 150 nm were sequentially formed.

These gallium nitride-based compound semiconductor layers were laminated by an MOCVD method under normal conditions well-known in the art.

Next, etching was performed by means of photolithography to expose the n-type GaN contact layer in a desired area, and an n-type electrode having a Ti/Au bilayer structure was formed onto the exposed face.

Next, to prepare a light-emitting element of a 350 µm square, a first mask having an approximately square opening of 320 µm side (in the schematic plan view of FIG. 1, the opening having a shape which can form the p-type ohmic contact layer) was formed by use of a resist according to the mask forming step described in the first embodiment. As the resist, AZ5200NJ (product name, manufactured by AZ Electronic Materials, Co., Ltd.) was used.

Next, with the first mask being provided, an ohmic contact layer of ITO having a thickness of 20 nm, a metal reflection layer of Ag having a thickness of 100 nm and a first anti-diffusion layer of Ti having a thickness of 100 nm were formed by a sputtering method.

Next, the first mask was removed by use of resist stripper.

Next, a second mask having an approximately square opening of 330 µm side (in the schematic plan view of FIG. 1, opening having a slightly larger shape than the opening to form the p-type ohmic contact layer) was formed by use of a resist according to the mask forming step described in the first embodiment. As the resist, AZ5200NJ (product name, manufactured by AZ Electronic Materials, Co., Ltd.) was used.

Next, with the second mask being provided, a first adhesion layer of Ta having a thickness of 40 nm, a bonding layer of Au having a thickness of 300 nm and a second adhesion layer of Ti having a thickness of 10 nm were formed by a sputtering method.

Next, the second mask was removed by use of resist stripper.

Next, a protection film of $SiO_2$ having 250 nm thickness was formed to cover the second adhesion layer, the top and side faces of the p-type semiconductor layer, and the exposed face of the n-type semiconductor layer.

Next, patterning was performed by known techniques of photolithography to etch a concave in a predetermined area of the p-type electrode, so as to expose a part of the bonding layer as well as the top face of the n-type electrode, so that the semiconductor light-emitting element of Example 1 was produced.

Next, according to the conditions shown in Tables 1 and 2, semiconductor light-emitting elements of Examples 2 to 4 and Comparative Examples 1 and 2 were produced in the same manner as Example 1. The obtained semiconductor light-emitting elements posses the features of the present invention.

TABLE 1

| | p-type electrode | | | | | | | | | Evaluation | | |
|---|---|---|---|---|---|---|---|---|---|---|---|---|
| | Ohmic contact layer | Metal reflection layer | First anti-diffusion layer | First adhesion layer | Second anti-diffusion layer | Bonding layer | Second adhesion layer | Insulating protective layer | n-type electrode | High temperature and humidity test | Corrosion resistance test | Peeling test |
| Example 1 | ITO, 20 nm | Ag, 100 nm | Ti, 100 nm | Ta, 40 nm | None | AU, 300 nm | Ti, 10 nm | $SiO_2$, 250 nm | Ti/Au | 0 | 0 | 0 |
| Example 2 | IZO, 15 nm | Ag, 200 nm | Ta, 100 nm | TaN, 40 nm | None | AU, 300 nm | Ta, 10 nm | $SiO_2$, 250 nm | Same construction as that of p-type electrode | 0 | 0 | 0 |
| Example 3 | IZO, 7 nm | Ag, 100 nm | Ta, 100 nm | Ti, 40 nm | W, 100 nm | AU, 300 nm | Ta, 20 nm | $SiO_2$, 300 nm | Described in separate Table 2 | 0 | 0 | 0 |
| Example 4 | IZO, 10 nm | Ag, 150 nm | Ta, 100 nm | Ni, 40 nm | Pt, 100 nm | AU, 300 nm | Ni, 10 nm | SiN, 300 nm | Described in separate Table 2 | 0 | 0 | 0 |
| Comparative Example 1 | ITO, 20 nm | Ag, 20 nm | Ti, 100 nm | None | None | AU, 200 nm | Ti, 10 nm | $SiO_2$, 250 nm | Ti/Au | 2 | 4 | 13 |
| Comparative Example 2 | ITO, 20 nm | Ag, 20 nm | Ti, 100 nm | None | Pt, 100 nm | AU, 200 nm | None | $SiO_2$, 250 nm | Ti/Au | 10 | 11 | 3 |

TABLE 2

| | n-type electrode | | | | | | | |
|---|---|---|---|---|---|---|---|---|
| | Ohmic contact layer | Metal reflection layer | First anti-diffusion layer | First adhesion layer | Second anti-diffusion layer | Bonding layer | Second adhesion layer | Insulating protective layer |
| Example 3 | Al, 100 nm | None | Ta, 100 nm | Ti, 40 nm | W, 100 nm | AU, 300 nm | Ta, 20 nm | $SiO_2$, 300 nm |
| Example 4 | Al, 100 nm | None | Ta, 100 nm | Ni, 40 nm | Pt, 100 nm | AU, 300 nm | Ni, 10 nm | SiN, 300 nm |

<Evaluation of Semiconductor Light Emitting Element>

Each semiconductor light-emitting element was evaluated in current-voltage characteristics and light-emitting characteristics.

For example, the semiconductor light-emitting element of Example 1 was measured in forward voltage. The forward voltage was 3.0 V at an applied current of 20 mA with energization by needle probes.

Then, light output was measured by a tester in a state of flip chip mount. The light output was 20 mW at an applied current of 20 mA. Regarding light emission distribution in the light-emitting face, it was observed that whole area under the positive electrode emits light.

The result on the current-voltage characteristics and light-emitting characteristics of each light-emitting element is shown in Table 1.

<Peeling Test>

The p-type electrode structures of Examples 1 to 4 and Comparative Examples 1 and 2 were formed in a pad shape of 80 μm diameter onto a GaN substrate, so that 100 peeling test samples were prepared on each of Examples 1 to 4 and Comparative Examples 1 and 2.

Next, bumps of 80 μm spherical diameter were formed at a position 30 μm shifted from the center of each pad, and tested whether peeling occurs or not. The number of the samples in which peeling was occurred among the 100 peeling test samples was counted.

The numbers of peeling test samples in which peeling occurred was summarized in the column "peeling test" of Table 1 with respect to Examples 1 to 4 and Comparative Examples 1 and 2.

<High Temperature and Humidity Test>

Each semiconductor light-emitting element (chip) was subjected to a high temperature and humidity test according to conventional methods. According to the test method, 100 pieces of each semiconductor light-emitting element (chip) were placed in a high temperature and humidity oven (μ-SERIES, Isuzu Seisakusho Co., Ltd.), a light-emitting test (energization to the chip of 5 mA, 2,000 hours) was carried out under an environment of a temperature of 85° C. and a relative humidity of 85 RH %, and the number of the samples which lost or decreased light emission (hereinafter, defective number) was then counted.

The defective numbers of each semiconductor light-emitting element (chip) are shown in the column "high temperature and humidity test" of Table 1 with respect to Examples 1 to 4 and Comparative Examples 1 and 2.

<Corrosion Resistance Test>

Each semiconductor light-emitting element was immersed in water in a water tank in the state that light was emitted at an applied current of 20 mA, a forward voltage of 3.0 V and a light output of 20 mV. After this state was kept for 10 min, the element was taken out from the water and measured in the light-emitting characteristics again. The number of samples in which the light-emitting characteristics deteriorated comparing before and after the immersion into water (hereinafter, defective number) was counted among the 100 samples with respect to Examples 1 to 4 and Comparative Examples 1 and 2.

The defective numbers of each semiconductor light-emitting element (chips) are shown in the column "corrosion resistance" of Table 1 with respect to Examples 1 to 4 and Comparative Examples 1 and 2.

It was proved that the semiconductor light-emitting elements of the present invention have superior effects.

Example 5

<Preparation of Semiconductor Light Emitting Element>

A semiconductor light-emitting element of a gallium nitride-based compound semiconductor of the present invention was produced as follows.

In the exactly same manner as Example 1, a base layer was formed onto a substrate via a buffer layer. A contact layer, a clad layer and a light-emitting layer of multiple quantum well structure was formed thereon. A clad layer and contact layer were sequentially formed further thereon.

Next, etching was performed by techniques of photolithography to expose an n-type GaN contact layer in a desired area, and an n-type electrode of a Ti/Au bilayer structure was formed onto the exposed face.

Next, to prepare a light-emitting element of 350 μm square, a mask having an approximately square opening of 320 μm side was formed according to the mask forming step of the invention. As a resist, AZ5200NJ (product name, manufactured by AZ Electronic Materials, Co., Ltd.) was used.

Next, with the mask being provided, an ohmic contact layer of IZO having 5 nm thickness was formed by a sputtering method.

Next, with the mask being provided, a metal reflection layer of Ag having 100 nm thickness and a first anti-diffusion layer of TaN having 50 nm thickness were formed by a sputtering method.

Next, after removing the mask and being placed in an oven, the element was heated up to 300° C. and maintained for 1 hour under a condition of a predetermined degree of vacuum, so that a heat treatment for increasing Ag density was performed.

Next, a mask was formed again, a bonding layer of Au having 300 nm thickness was formed, and then the mask was removed.

Next, an insulation protective film of $SiO_2$ having 250 nm thickness was formed to cover the top and side faces of the p-type semiconductor layer 106 and the exposed face of the n-type semiconductor layer by a sputtering method.

Next, patterning was performed by known techniques of lithography, a concave was etched in a predetermined area of the p-type electrode to expose a part of the bonding layer as well as the top face of the n-type electrode. The semiconductor light-emitting element of Example 5 was thus produced.

<Evaluation of Semiconductor Light Emitting Element>

The semiconductor light-emitting element of Example 5 was measured in forward voltage. The forward voltage was 3.1 V at an applied current of 20 mA with energization by needle probes.

The light output was 22 mW at an applied current of 20 mA. Regarding light emission distribution in the light-emitting face, it was observed that whole area under the positive electrode emits light.

Examples 6 and 7, and Comparative Examples 3 and 4

Semiconductor light-emitting elements were prepared in the same manner as Example 5, except the conditions shown in Table 2.

Chips had an emission wavelength of 460 nm as with Example 5. After the chips were maintained for 10 min under $N_2$ atmosphere at a temperature of room temperature, 200° C., 300° C. and 400° C., they were measured in forward voltage (Vf) and light output (Po).

Light output was measured in the way that each semiconductor light-emitting element was mounted on a TO-18 can package, and the light output was measured by a tester at an applied current of 20 mA.

The semiconductor light-emitting elements of Examples 5 to 11 had a luminous efficacy of 20 mW or more at 20° C. and an applied current of 20 mA. However, under the conditions of Comparative Examples 3 and 4, the element constituting the metal reflection layer was unable to diffuse under high temperatures. The reflectivity of the metal reflection layers was thus deteriorated and luminous efficiency was decreased.

Although details are omitted here, lamps provided with the chip of the invention shown in Table 2 on various mounting substrates were produced. Also, such lamps were fixed onto reflectors for lighting device according to the description of JP-A-2008-16412, and a plurality of lighting device provided with the reflectors for lighting device were produced. Such lamps were applied to electronic equipment and various mechanical devices. It was confirmed that the effect of the present invention was obtained.

TABLE 3

| | Ohmic contact layer | | Metal reflection layer | | First anti-diffusion layer | | Bonding layer | | Evaluation results (λd = 460 nm, Applied current: 20 mA) | | | | | | | |
|---|---|---|---|---|---|---|---|---|---|---|---|---|---|---|---|---|
| | | | | | | | | | Normal temperature (20° C.) | | 200° C. | | 300° C. | | 400° C. | |
| | Material | Thickness (nm) | Material | Thickness (nm) | Material | Thickness (nm) | Material | Thickness (nm) | Vf(V) | $P_0$ (mW) | Vf (V) | $P_0$ (mW) | Vf (V) | $P_0$ (mW) | Vf (V) | $P_0$ (mW) |
| Example 5 | IZO | 5 | Ag | 100 | TaN | 50 | AU | 300 | 3.10 | 22.0 | 3.10 | 22.0 | 3.10 | 22.0 | 3.10 | 22.0 |
| Example 6 | ITO | 5 | APC-TR | 100 | Ta | 50 | AU | 300 | 3.10 | 22.0 | 3.10 | 22.0 | 3.10 | 22.0 | 3.10 | 22.0 |
| Example 7 | ICO | 5 | Ag | 100 | Ti | 50 | AU | 300 | 3.10 | 22.0 | 3.10 | 22.0 | 3.10 | 22.0 | 3.10 | 22.0 |
| Example 8 | IGO | 5 | Ag | 100 | Ni | 50 | AU | 300 | 3.10 | 22.0 | 3.10 | 22.0 | 3.10 | 22.0 | 3.10 | 22.0 |
| Example 9 | IZO | 10 | Ag | 200 | Ta | 50 | AU | 400 | 3.10 | 22.0 | 3.10 | 22.0 | 3.10 | 22.0 | 3.10 | 22.0 |
| Example 10 | ITO | 10 | Ag | 200 | Ta | 50 | AU | 500 | 3.10 | 22.0 | 3.10 | 22.0 | 3.10 | 22.0 | 3.10 | 22.0 |
| Example 11 | IGO | 5 | Ag | 100 | Nb | 50 | AU | 300 | 3.10 | 22.0 | 3.10 | 22.0 | 3.10 | 22.0 | 3.10 | 22.0 |
| Comparative Example 3 | IZO | 5 | Ag | 100 | Pt | 50 | AU | 300 | 3.10 | 22.0 | 3.10 | 22.0 | 3.10 | 21.0 | 3.10 | 22.0 |
| Comparative Example 4 | Pt | 5 | Ag | 100 | Pt | 50 | AU | 300 | 3.10 | 21.0 | 3.10 | 21.0 | 3.20 | 20.5 | 3.30 | 18.0 |

INDUSTRIAL APPLICABILITY

The present invention relates to a semiconductor light-emitting element, a lamp, a lighting device, an electronic equipment and an electrode, and is particularly applicable in industries of producing and using semiconductor light-emitting elements having electrodes which are improved in adhesion.

Description of Reference Numeral
1: Semiconductor light-emitting element
4: Lamp
10: Insulation protective film
10e: Inclined face
10g: Outer periphery
16: Cutout
17: cutout body
20: Laminated semiconductor layer
21: Insoluble resist
22: Soluble resist
23: Cured resist
27: First mask
27c: Opening
27d: Inner wall
28: Second mask
28c: Opening
28d: Inner wall
51: Ohmic contact layer
51e: Inclined face
52: Metal reflection layer
52e: Inclined face
53: First anti-diffusion layer
53e: Inclined face
54: First adhesion layer
54d: Outer peripheral portion
54e: Inclined face
55: Bonding layer
55e: Inclined face
56: Second adhesion layer
56e: Inclined face
61: Mounting substrate
61a: One face
62: Other wiring portion (lead wire)
62a: One end
62b: Other end
63: One wiring portion (lead wire)
63a: One end
63b: Other end
70: Wall member
70a: Hole
70b: Inclined face
74: Bump
76, 78: Sealing resin (mold)
101: Substrate
102: Buffer layer
103: Base layer
104: n-type semiconductor layer
104a: n-contact layer
104b: n-clad layer
104c: Exposed face
105: Light emitting layer
105a: barrier layer 105b: well layer
106: p-type semiconductor layer
106a: p-clad layer
106b: p-contact layer
106c: Surface opposite to substrate (top surface)
108: n-type electrode (the other electrode)
111: p-type electrode (one electrode)
111c: Concave
111e: Inclined face

The invention claimed is:

1. A semiconductor light-emitting element comprising
a substrate;
a laminated semiconductor layer in which an n-type semiconductor layer, a light-emitting layer and a p-type semiconductor layer are laminated on the substrate in this order;
one electrode joined with the p-type semiconductor layer; and
the other electrode joined with the n-type semiconductor layer,
wherein one or both of the one and other electrodes has a structure such that an ohmic contact layer, a metal reflection layer and a first anti-diffusion layer are laminated in this order, and the ohmic contact layer is made of an oxide containing at least one metal selected from the group consisting of In, Zn, Al, Ga, Ti, Bi, Mg, W, Ce, Sn and Ni.

2. A method for producing the semiconductor light-emitting element according to claim 1,
wherein the step of forming one or both of the one and other electrodes of the semiconductor light-emitting element comprises the steps of: forming the ohmic contact layer onto one or both of the p-type semiconductor layer and n-type semiconductor layer; heat-treating the ohmic contact layer; and laminating the metal reflection layer and first anti-diffusion layer onto the ohmic contact layer in this order.

3. The semiconductor light-emitting element according to claim 1, wherein the ohmic contact layer is made of any one of ITO, IZO, AZO or GZO.

4. The semiconductor light-emitting element according to claim 1, wherein the ohmic contact layer has a maximum thickness of 1 nm to 500 nm.

5. The semiconductor light-emitting element according to claim 1, wherein the ohmic contact layer includes an inclined face at an outer peripheral portion, wherein a film thickness gradually becomes smaller toward an outer peripheral portion.

6. The semiconductor light-emitting element according to claim 1, wherein the metal reflection layer is made of Ag or Rh, or an alloy containing any one of these metals.

7. The semiconductor light-emitting element according to claim 1, wherein the metal reflection layer is made of an Ag-Pd-Cu alloy or an Ag-Nd-Cu alloy.

8. The semiconductor light-emitting element according to claim 1, wherein the metal reflection layer has a maximum thickness of 20 nm to 3,000 nm.

9. The semiconductor light-emitting element according to claim 1, wherein the metal reflection layer includes an inclined face at an outer peripheral portion, wherein a film thickness gradually becomes smaller toward an outer peripheral portion.

10. The semiconductor light-emitting element according to claim 1, wherein the first anti-diffusion layer is made of any one metal of Ti, Ni, Ta, Cr and Nb, any one of nitrides of the metals, or any one of alloys of the metals.

11. The semiconductor light-emitting element according to claim 1, wherein the first anti-diffusion layer includes an inclined face at an outer peripheral portion, wherein a film thickness gradually becomes smaller toward an outer peripheral portion.

12. The semiconductor light-emitting element according to claim 1, wherein the laminated semiconductor layer is mainly composed of a gallium nitride-based semiconductor.

13. A lamp comprising the semiconductor light-emitting element according to claim 1.

14. A lamp comprising
the semiconductor light-emitting element according to claim 1; and
a mounting substrate;
wherein the mounting substrate comprises one wiring portion and the other wiring portion on one face, the other wiring being arranged separately from the one wiring portion, the semiconductor light-emitting element is arranged so that the substrate of the semiconductor light-emitting element is on an opposite side to the mounting substrate, the one electrode of the semiconductor light-emitting element is connected with the one wiring portion, and the other electrode of the semiconductor light-emitting element is connected with the other wiring portion.

15. An electronic equipment comprising the lamp according to claim 14 incorporated therein.

16. A mechanical device comprising the electronic equipment according to claim 15 incorporated therein.

17. A semiconductor light-emitting element comprising
a substrate;
a laminated semiconductor layer in which an n-type semiconductor layer, a light-emitting layer and a p-type semiconductor layer are laminated on the substrate in this order;
one electrode joined with the p-type semiconductor layer; and
another electrode joined with the n-type semiconductor layer,
wherein one or both of the one and other electrodes has a structure such that an ohmic contact layer, a metal reflection layer, a first anti-diffusion layer and a first adhesion layer are laminated in this order, and the first adhesion layer has an outer peripheral portion which extends so as to be in contact with the laminated semiconductor layer, so as to completely cover the first anti-diffusion layer.

18. The semiconductor light-emitting element according to claim 17, wherein the first adhesion layer comprises an inclined face at an outer peripheral portion, wherein a film thickness gradually becomes smaller toward an outer peripheral portion.

19. The semiconductor light-emitting element according to claim 17, wherein the ohmic contact layer is made of a translucent conductive material selected from the group consisting of conductive oxides containing at least one of In, Zn, Al, Ga, Ti, Bi, Mg, W, Ce, Sn and Ni.

20. The semiconductor light-emitting element according to claim 17, wherein the metal reflection layer is made of any one selected from the group consisting of Ag, Al, Ru, Rh, Pd, Os, Ir, Pt, Ti, and alloys of these metals.

21. The semiconductor light-emitting element according to claim 17, wherein the first anti-diffusion layer is made of any one selected from the group consisting of Ta, Ti, Ni, and alloys of these metals.

22. The semiconductor light-emitting element according to claim 17, wherein the first adhesion layer is made of any one selected from the group consisting of Ta, Ti, Ni, alloys of the metals, and nitride compounds of these metals.

23. The semiconductor light-emitting element according to claim 17, wherein a second anti-diffusion layer is formed to cover the first adhesion layer.

24. The semiconductor light-emitting element according to claim 23, wherein the second anti-diffusion layer is made of any one selected from the group consisting of Ru, Rh, Pd, Os, Ir, Pt, W, and alloys of these metals.

25. The semiconductor light-emitting element according to claim 17, wherein a bonding layer is formed to cover the first adhesion layer or second anti-diffusion layer.

26. The semiconductor light-emitting element according to claim 25, wherein the bonding layer is made of any one selected from the group consisting of Au, Al, and alloys of these metals.

27. The semiconductor light-emitting element according to claim 17, wherein a second adhesion layer is formed to cover the bonding layer.

28. The semiconductor light-emitting element according to claim 27, wherein the second adhesion layer is made of any one selected from the group consisting of Ti, Ta, Ni, and alloys of these metals.

29. The semiconductor light-emitting element according to claim 17, wherein an insulation protective film is formed to cover the second adhesion layer.

30. The semiconductor light-emitting element according to claim 17, wherein the laminated semiconductor layer is mainly composed of a gallium nitride-based semiconductor.

31. A lamp comprising
a mounting substrate comprising one wiring portion and the other wiring portion on one face, the other wiring being arranged separately from the one wiring portion; and
the semiconductor light-emitting element according to claim 1 arranged on the one face of the mounting substrate,
wherein the one electrode of the semiconductor light-emitting element is connected with the one wiring portion, the other electrode of the semiconductor light-emitting element is connected with the other wiring portion, and the substrate of the semiconductor light-emitting element is arranged to be on an opposite side to the mounting substrate.

32. A lighting device comprising the lamp according to claim 31 incorporated therein.

33. An electronic equipment comprising the lamp according to claim 31 incorporated therein.

34. An electrode for a semiconductor light-emitting element comprising
a substrate;
a laminated semiconductor layer in which an n-type semiconductor layer, a light-emitting layer and a p-type semiconductor layer are laminated on the substrate in this order;
one electrode joined with the p-type semiconductor layer; and
the other electrode joined with the n-type semiconductor layer which is exposed by cutting away a part of the laminated semiconductor layer,
wherein one or both of the one and other electrodes has a structure such that an ohmic contact layer, a metal reflection layer, a first anti-diffusion layer and a first adhesion layer are laminated in this order, and the first adhesion layer includes an outer peripheral portion which extends so as to be in contact with the laminated semiconductor layer, so as to completely cover the first anti-diffusion layer.

35. The electrode for semiconductor light-emitting element according to claim 34, wherein the first adhesion layer includes an inclined face at an outer peripheral portion, wherein a film thickness which gradually becomes smaller toward an outer peripheral side.

36. The electrode for semiconductor light-emitting element according to claim 34, wherein a bonding layer is formed to cover the first adhesion layer.

* * * * *